US012255089B2

(12) United States Patent
Hudgens et al.

(10) Patent No.: US 12,255,089 B2
(45) Date of Patent: Mar. 18, 2025

(54) ROBOT APPARATUS, SYSTEMS, AND METHODS FOR TRANSPORTING SUBSTRATES IN ELECTRONIC DEVICE MANUFACTURING

(71) Applicant: Applied Materials, Inc., Santa Clara, CA (US)

(72) Inventors: Jeffrey C. Hudgens, San Francisco, CA (US); Karuppasamy Muthukamatchi, Madurai (IN)

(73) Assignee: Applied Materials, Inc., Santa Clara, CA (US)

( * ) Notice: Subject to any disclaimer, the term of this patent is extended or adjusted under 35 U.S.C. 154(b) by 811 days.

(21) Appl. No.: 17/357,719

(22) Filed: Jun. 24, 2021

(65) Prior Publication Data
US 2022/0005726 A1 Jan. 6, 2022

(30) Foreign Application Priority Data
Jul. 2, 2020 (IN) .............................. 202041028186

(51) Int. Cl.
*H01L 21/687* (2006.01)
*B25J 9/00* (2006.01)
(Continued)

(52) U.S. Cl.
CPC ...... *H01L 21/68707* (2013.01); *B25J 9/0084* (2013.01); *B25J 17/025* (2013.01); *B25J 18/00* (2013.01)

(58) Field of Classification Search
None
See application file for complete search history.

(56) References Cited

U.S. PATENT DOCUMENTS 8,777,540 B2 * 7/2014 Rebstock .......... H01L 21/68707
414/217
8,951,002 B2 * 2/2015 Kremerman ............. B25J 9/042
414/744.1
(Continued)

FOREIGN PATENT DOCUMENTS

CN 109414821 A 3/2019
JP 2006289555 A 10/2006
(Continued)

OTHER PUBLICATIONS

International Search Report of International Application No. PCT/US2021/039711 mailed Oct. 5, 2021, 3 pgs.

*Primary Examiner* — Michael S Lowe
(74) *Attorney, Agent, or Firm* — LOWENSTEIN SANDLER LLP

(57) ABSTRACT

Electronic device manufacturing systems, robot apparatus and associated methods are described. The robot apparatus includes an arm having an inboard end and an outboard end, the inboard end is configured to rotate about a shoulder axis; a first forearm is configured for independent rotation relative to the arm about an elbow axis at the outboard end of the arm; a first wrist member is configured for independent rotation relative the first forearm about a first wrist axis at a distal end of the first forearm opposite the elbow axis, wherein the first wrist member includes a first end effector and a second end effector. The robot apparatus further includes a second forearm configured for independent rotation relative to the arm about the elbow axis; a second wrist member configured for independent rotation relative the second forearm about a second wrist axis, wherein the second wrist member comprises a third end effector and a fourth end effector. The robot apparatus further includes a third forearm configured for independent rotation relative to the arm about the elbow axis; and a third wrist member (Continued)

configured for independent rotation relative the third forearm about a third wrist axis, wherein the third wrist member includes a fifth end effector and a sixth end effector.

20 Claims, 25 Drawing Sheets

(51) Int. Cl.
*B25J 17/02* (2006.01)
*B25J 18/00* (2006.01)

(56) References Cited

U.S. PATENT DOCUMENTS

| | | | |
|---|---|---|---|
| 10,011,022 B1* | 7/2018 | Lin | ............... B25J 15/0061 |
| 2005/0220576 A1 | 10/2005 | Kim et al. | |
| 2008/0251473 A1 | 10/2008 | Rebstock et al. | |
| 2012/0045308 A1 | 2/2012 | Kremerman | |
| 2013/0071218 A1* | 3/2013 | Hosek | ............... H01L 21/67742 |
| | | | 414/744.5 |
| 2013/0149076 A1* | 6/2013 | Cox | ..................... B25J 17/02 |
| | | | 414/217 |
| 2014/0154038 A1 | 6/2014 | Hudgens et al. | |
| 2016/0293467 A1 | 10/2016 | Caveney et al. | |
| 2017/0092518 A1 | 3/2017 | Takano | |
| 2018/0269088 A1 | 9/2018 | Nozawa | |

FOREIGN PATENT DOCUMENTS

| | | |
|---|---|---|
| JP | 2007038360 A | 2/2007 |
| JP | 2013131543 A | 7/2013 |
| JP | 2014033222 A | 2/2014 |
| JP | 2019195069 A | 11/2019 |
| JP | 2019208073 A | 12/2019 |
| KR | 10-2014-0144322 A | 12/2014 |

* cited by examiner

ROBOT APPARATUS, SYSTEMS, AND METHODS FOR TRANSPORTING SUBSTRATES IN ELECTRONIC DEVICE MANUFACTURING

FIELD

The present disclosure relates to electronic device manufacturing, and more specifically to an apparatus and methods adapted to transport multiple substrates within an electronic device manufacturing apparatus.

BACKGROUND

Conventional electronic device manufacturing systems can include process chambers and load lock chambers each containing multiple substrate supports to hold a corresponding number of substrates for simultaneous processing. Such process chambers may be included in a cluster tool where several of the chambers and load locks are distributed about a transfer chamber. Alternatively, the process chambers can be included in a linear tool where the process chambers and load locks are distributed about a rectangular transfer chamber.

Electronic device manufacturing systems can employ a robot apparatus in the transfer chamber that is configured to transport substrates between a load lock and the process chambers. The transfer chamber, process chambers, and load locks may operate under a vacuum at certain times. However, in some configurations of electronic device manufacturing systems, transport of substrates between the various chambers with the robot apparatus can be inefficient, and can involve multiple trips of a robot arm between the load lock and a processing chamber.

Accordingly, an improved robot apparatus, electronic device manufacturing apparatus, and methods for transporting substrates having improved efficiency are sought.

SUMMARY

Disclosed herein according to embodiments is a robot apparatus, comprising: an arm comprising an inboard end and an outboard end, the inboard end configured to rotate about a shoulder axis; a first forearm configured for independent rotation relative to the arm about an elbow axis at the outboard end of the arm; a first wrist member configured for independent rotation relative the first forearm about a first wrist axis at a distal end of the first forearm opposite the elbow axis, wherein the first wrist member comprises a first end effector and a second end effector; a second forearm configured for independent rotation relative to the arm about the elbow axis; a second wrist member configured for independent rotation relative the second forearm about a second wrist axis, wherein the second wrist member comprises a third end effector and a fourth end effector; a third forearm configured for independent rotation relative to the arm about the elbow axis; and a third wrist member configured for independent rotation relative the third forearm about a third wrist axis, wherein the second wrist member comprises a fifth end effector and a sixth end effector.

In further embodiments, disclosed herein is a robot apparatus, comprising: a first arm comprising a first inboard end and a first outboard end, the first inboard end configured to rotate about a shoulder axis; a first forearm configured for independent rotation relative to the first arm about a first elbow axis at the outboard end of the first arm; a first wrist member configured for independent rotation relative to the first forearm about a first wrist axis at a distal end of the first forearm opposite the first elbow axis, wherein the first wrist member comprises a first end effector and a second end effector; a second arm comprising a second inboard end and a second outboard end, the second inboard end configured to rotate about the shoulder axis; a second forearm configured for independent rotation relative to the second arm about the second elbow axis; a second wrist member configured for independent rotation relative to the second forearm about a second wrist axis, wherein the second wrist member comprises a third end effector and a fourth end effector; and a third forearm configured for independent rotation relative to the first arm about a third elbow axis; and a third wrist member configured for independent rotation relative to the third forearm about a third wrist axis, wherein the third wrist member comprises a fifth end effector and a sixth end effector.

In yet further embodiments, disclosed herein is an electronic device manufacturing apparatus, comprising: a mainframe comprising a transfer chamber and at least two process chambers; a first load lock coupled to the mainframe; a second load lock coupled to the mainframe; and a robot apparatus configured to transport substrates between the first load lock and the second load lock and the at least two process chambers, the robot apparatus comprising: an arm comprising an inboard end and an outboard end, the inboard end configured to rotate about a shoulder axis; a first forearm configured for independent rotation relative to the arm about an elbow axis at the outboard end of the arm; a first wrist member configured for independent rotation relative the first forearm about a first wrist axis at a distal end of the first forearm opposite the elbow axis, wherein the first wrist member comprises a first end effector and a second end effector; a second forearm configured for independent rotation relative to the arm about the elbow axis; a second wrist member configured for independent rotation relative the second forearm about a second wrist axis, wherein the second wrist member comprises a third end effector and a fourth end effector; a third forearm configured for independent rotation relative to the arm about the elbow axis; and a third wrist member configured for independent rotation relative the third forearm about a third wrist axis, wherein the second wrist member comprises a fifth end effector and a sixth end effector.

Numerous other features are provided in accordance with these and other aspects of the disclosure. Other features and aspects of the present disclosure will become more fully apparent from the following detailed description, the claims, and the accompanying drawings.

DETAILED DESCRIPTION

Figure 1:
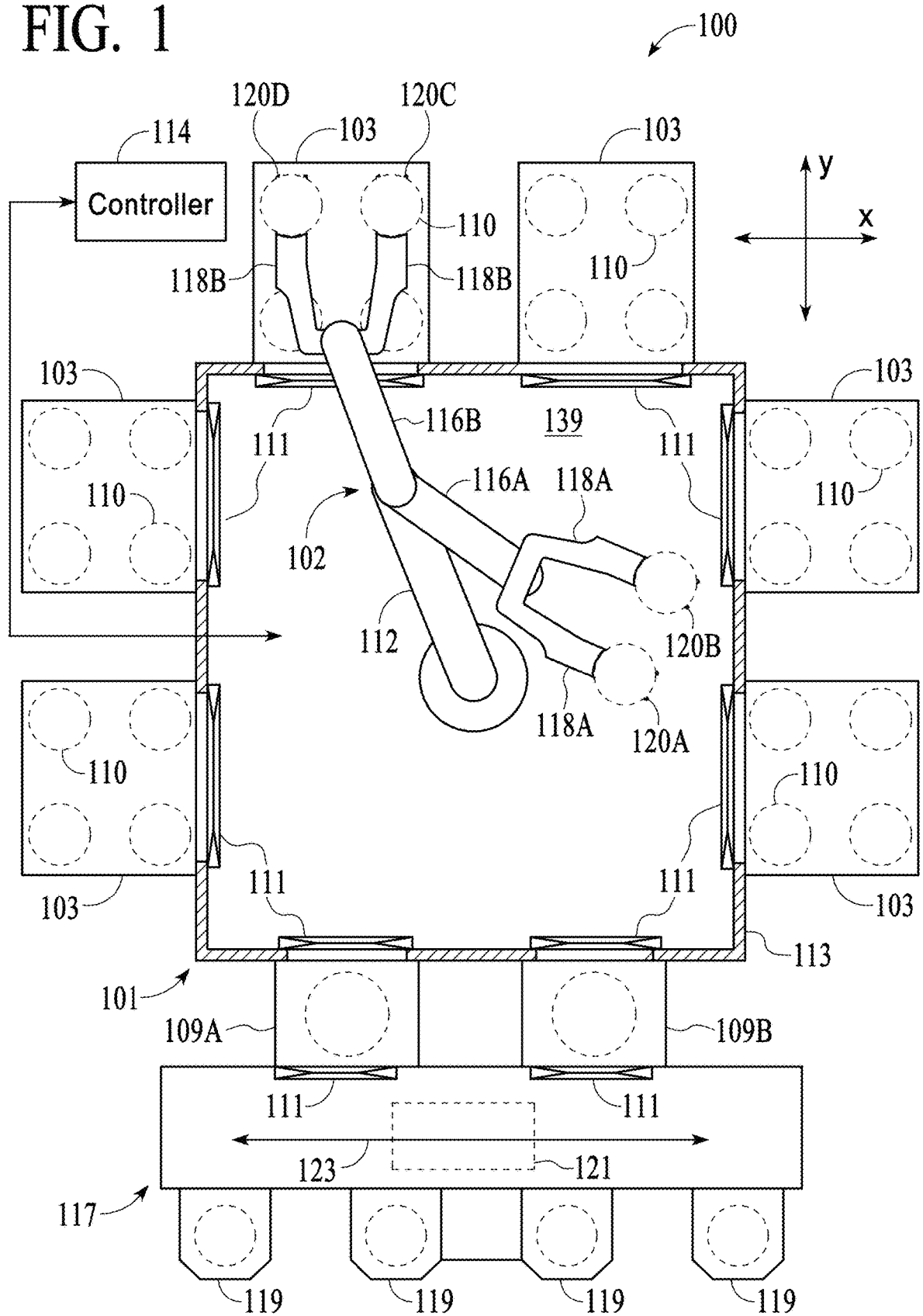
FIG. 1 illustrates an above view of a substrate processing system including a robot apparatus according to one or more embodiments.

Precision and efficiency in transporting substrates between various locations in electronic device transport systems is sought. However, in some systems, transfer between the various chambers may become a bottleneck that limits efficiency. In steady state production, it is ideal to keep the processes running 100% of the time for maximum utilization. To optimize efficiency, a robot should be configured to swap processed substrates with unprocessed substrates in as few cycles as possible. Providing a robot apparatus that can retrieve, place and transport multiple substrates in, for example, one or two cycles (e.g., with only one or fewer trips to the load lock) can help improve efficiency. In a system that is process limited, for example, has an hour long process, the most efficient sequence is to open the slit valve, unload and reload all substrates, and then close the slit valve, minimizing the overhead in the substrate transfer process to maximize productivity. Robots, for example, having twin wrist members that include two end effectors can unload and reload, for example, a four (4) or six (6) substrate chamber in one cycle without having to return to the load lock in embodiments. The robots may be of a "butterfly motion" configuration where the motion behavior for these robots enables any one blade to extend and retract independent of the other blades. Such robots can increase the utilization of the process chamber and the productivity of the process tool. Robots according to embodiments herein may be multi-blade robots that are optimized for high productivity and multi-substrate process chambers.

In traditional electronic device manufacturing systems, the robots do not reload the chamber directly (i.e., in one load/unload cycle). Instead, the robot performs multiple cycles to unload a full process chamber of processed substrates, and performs multiple cycles to reload the process chamber with unprocessed substrates. For example, a standard setup is a two arm robot, which includes two end effectors, one on each arm, each of which can hold a substrate. To empty and refill a quad chamber (i.e., with four substrate supports), the robot retrieves two processed substrates from the process chamber, moves to the load lock, places the two processed substrates at the load lock, picks up two unprocessed substrates from the load lock (or another load lock), returns to the process chamber, places the two unprocessed substrates at the process chamber, retrieves the remaining two processed substrates from the process chamber, returns to the load lock, places the two processed substrates at the load lock, picks up two more unprocessed substrates, returns to the process chamber, and places the two more unprocessed substrates in the process chamber. Or similarly, can swap each wafer in the chamber in series with a new wafer retrieved from the load lock during each cycle. In contrast, embodiments described herein provide an electronic device manufacturing system in which the transfer chamber robot has a capacity that is at least one greater than a process chamber capacity (or combined process chamber capacity of a set of process chambers). Embodiments, enable a load/unload sequence to be performed in a single cycle, drastically increasing the throughput of the transfer chamber robot.

Embodiments described herein relate to systems including at least one process chamber, at least one load lock and a robot apparatus (also referred to herein as a robot assembly or simply a robot) to maximize substrate handling efficiency when transporting substrates between the at least one process chamber and the at least one load lock (or via or pass-through). The at least one process chamber can be a multi-substrate process chamber having a plurality of substrate supports within the chamber and, if present, one or more additional substrate supports within a substrate holding chamber (a.k.a. a "via"). Embodiments described herein also relate to specific transfer chamber robots that can increase throughput of the transfer chamber.

The at least one process chamber can be any suitable shape. For example, the at least one process chamber can be square, linear (e.g., rectangular), radial, a hybrid combination of any of the foregoing or any other shape known to those of ordinary skill in the art. In embodiments, the at least one process chamber is any suitable shape supported by the robot apparatus kinematics, for example, a radial SCARA with at least four (4) end effectors on a radial mainframe (i.e., transfer chamber) or a mainframe with another shape. As shown, for example, in FIG. 1, the transfer chamber may have a square shape with four equally sized sides (also referred to as facets). Alternatively, the transfer chamber may have a rectangular shape with two approximately parallel facets having a first length and two approximately parallel facets having a second length. The mainframe/transfer chamber may also have other numbers of sides/facets, such as 5 sides, 6 sides, seven sides, eight sides, and so on. The sides may have the same dimensions as one another, or may have different dimensions.

The robot apparatus is configured to unload and reload (e.g., swap, retrieve and place) substrates within the at least one process chamber in a single load/unload cycle (i.e., without returning to a load lock or another station to retrieve and/or place substrates before completely swapping the substrates in the at least one process chamber).

For example, if a multi-substrate process chamber includes four (4) substrate supports, the robot apparatus in embodiments may include at least six (6) end effectors. During a transfer, four (4) of the end effectors may hold unprocessed substrates and two of the end effectors may be empty. During a transfer, first and second (empty) end effectors may retrieve two processed substrates from first and second substrate supports within the process chamber. Third and fourth end effectors may then place two unprocessed substrates on the first and second substrate supports. The now empty third and fourth end effectors may retrieve the two remaining processed substrates from third and fourth substrate supports within the process chamber. Finally, with the fifth and sixth end effectors, the robot may place two unprocessed substrates on the third and fourth substrate supports. The robot can then move to the load lock, and place the four processed substrates in the load lock chamber. Thus, the robot is capable of swapping out four unprocessed substrates for four processed substrates within a single cycle. Thus, the robot is capable of swapping out four unprocessed substrates for four processed substrates within a single cycle.

In embodiments, a system may include at least one multi-substrate process chamber containing multiple substrate supports that are accessible by a robot apparatus having a forearm or wrist member with twin end effectors.

As used herein, the term "twin end effectors," refers to a single wrist member having two (e.g., identical) end effectors). The multiple substrates may be positioned radially within the process chamber or in rows in embodiments. The twin end effectors are configured to simultaneously retrieve two substrates from two substrate supports at a time. In an example, a wrist member of a robot apparatus may approximately have a horizontally oriented U shape, where a first end effector is positioned at a first distal end of the U shape and a second end effector is positioned at a second distal end of the U shape. The wrist members may be rigid bodies, and the relative positions of the first end effector and second end effector may be fixed for each twin wrist member. In embodiments, the multi-substrate process chamber can include four substrate supports in a circular configuration or in two rows (e.g., two rows in from the opening of the chamber) and the robot apparatus can include three forearms, each with twin end effectors at a distal end thereof. During a substrate transfer, four (4) of the end effectors can hold four (4) unprocessed substrates and two of the end effectors are empty. The empty twin end effectors can simultaneously retrieve two processed substrates from two of the substrate supports. The robot apparatus then rotates and simultaneously places two unprocessed substrates on the two empty substrate supports. The now empty end effectors may retrieve the remaining two processed substrates from the other substrate supports. The robot apparatus may then place the remaining two unprocessed substrates onto the empty substrate supports. The swap of the processed substrates with the unprocessed substrates is completed within a single cycle.

Systems as described herein can include a robot apparatus having four or more end effectors. End effector (also referred to as a blade) as used herein means a portion of or attachment to an arm, forearm or wrist member that is configured to hold a substrate. Robot apparatus embodiments described herein can include two or more arm components, optionally two or more forearm components, optionally two or more wrist components and a plurality of end effectors (e.g., at least 6) coupled to the one or more arm, forearm or wrist components.

Systems as described herein further include at least one load lock containing at least one substrate support. The at least one load lock can be a single substrate load lock or a multi-substrate load lock. In embodiments, the system can include at least two load locks. One load lock can be designated for loading and the other load lock can be designated for unloading. In embodiments, both load locks can be configured for loading and unloading. The productivity of the system can be increased through the use of at least one multi-substrate load lock where the robot apparatus having multiple end effectors is configured to simultaneously swap all the substrates between the end effectors and the substrate supports within the multi-substrate load lock. For example, the load lock can include multiple substrate supports and if the substrate supports are all empty, the robot apparatus can be pitched and configured to simultaneously place all substrates on the substrate supports. In embodiments, the robot apparatus is then positioned by an adjacent multi-substrate load lock to simultaneously retrieve unprocessed substrates from substrate supports in the adjacent load lock.

Further details and example embodiments illustrating various aspects of the systems and robot apparatus are described with reference to FIGS. 1-10C herein.

Referring now to FIG. 1, an example embodiment of an electronic device manufacturing system 100 according to embodiments of the present disclosure is provided. The electronic device processing system 100 can include a mainframe 101 including a transfer chamber 113 and at least two of the plurality of process chambers 103. A housing of the mainframe 101 includes the transfer chamber 113 therein. The transfer chamber 113 can include a top wall (not shown), bottom wall (floor) 139, and side walls. In some embodiments, the transfer chamber 113 may be maintained in a vacuum. In the depicted embodiment, a robot apparatus 102, such as depicted in FIGS. 2A-10C, is mounted to the bottom wall (floor) 139. However, it could be mounted elsewhere, such as to the top wall (not shown-removed for clarity). As discussed above, the transfer chamber can be any suitable shape known to those of ordinary skill in the art.

Process chambers 103 may be adapted to carry out any number of processes on the substrates (not shown). The processes can include deposition, oxidation, nitration, etching, polishing, cleaning, lithography, metrology, or the like. Other processes may be carried out as well. Each process chamber 103 may include at least one substrate support 110. All of the process chambers 103 are multi-substrate chambers each having four (4) substrate supports 110.

The robot apparatus 102 may include a plurality of end effectors (e.g., four as shown, six or eight) to transport the substrates between the process chamber 103 and the load lock 109A, 109B. In the illustrated embodiment, the robot apparatus 102 includes an arm 112. The arm 112 includes two forearms 116A (not shown) and 116B independently rotatable about the arm 112. Each forearm 116A and 116B includes a respective twin wrist member 118A (not shown) and 118B. As shown, a single twin wrist member 118B, may include two wrist limbs each having a respective end effector 120C and 120D attached at the end of the limb to transport two substrates at a time.

System 100 further includes a load lock apparatus 109A, 109B configured to interface with a factory interface 117 or other system component, that may receive substrates from substrate carriers 119 (e.g., Front Opening Unified Pods (FOUPs)) that can be docked at load ports of the factory interface 117, for example. A load/unload robot 121 (shown dotted) may be used to transfer substrates between the substrate carriers 119 and the load lock apparatus 109A, 109B. Transfers of substrates may be carried out in any sequence or direction. Load/unload robot 121 may be similar to the robot apparatus 102 in some embodiments, but may include a mechanism to allow the robot apparatus to move laterally in either lateral direction as indicated by arrow 123. In one embodiment, robot apparatus 102 is configured to operate in vacuum, while load/unload robot 121 may not be configured to operate in vacuum. Any other suitable robot can be used. As shown, transfers may occur through slit valves 111 and the substrates may be retrieved, and or deposited, from or to load lock apparatus 109A and 109B.

Each load lock 109A, 109B includes at least one substrate support 110A, 110B. In embodiments, load lock 109A can be configured for robot 102 to retrieve unprocessed substrates (i.e., the inlet) as loaded from substrate carriers 119 and load lock 109B can be configured to place processed substrates as received from the process chambers 103 (i.e., the outlet). In embodiments, each load lock 109A, 109B contains a plurality of substrate supports, for example, the same number as in the process chambers, four (4) as shown. The substrate supports can be pitched vertically to enable at least some of the processed substrates held by end effectors 118A-118F of robot 102 to be simultaneously retrieved from or placed by robot 102 on substrate supports 110 in load lock 109A, 109B.

In the use case shown in FIG. 1, the robot apparatus 102 is a double twin blade robot that may sequentially unload and reload substrates from and to each process chamber 103. For example, the robot 102 carrying two (2) unprocessed substrates on two of the four end effectors 120A-120B, may have two empty end effectors 120C, 120D (for example). The empty end effectors 120C, 120D retrieve two processed substrates from two substrate supports 110 in a first one of the process chambers 103. The robot 102 then rotates the blades and places two unprocessed substrates using end effectors 120A, 120B (for example) on the empty substrate supports in the first process chamber 103. Using the empty end effectors 120A, 120B, the robot 102 then retrieves the remaining two processed substrates from the remaining two substrate supports 110. After retrieving all of the processed substrates, the robot 102 then returns to the load lock 109A to exchange the processed substrates with unprocessed substrates two at a time. For example, the robot 102 may place two processed substrates with end effectors 120A, 120B and then using the same end effectors may retrieve two unprocessed substrates from two substrate supports within the load lock 109A. Using end effectors 120C, 120D, the robot 102 may place the two processed substrates on two substrate supports within the load lock such that two end effectors 120A-120B (for example) hold unprocessed substrates and two end effectors 120C, 120D (for example) are empty. The robot 102 may then proceed to unload/reload the process chambers 103.

In some embodiments, in the use case shown in FIG. 1, the robot apparatus 102 may be a triple twin blade robot such as described with respect to FIGS. 3A-3B, 6A-6C, 9A-9C a quadruple twin blade robot such as described with respect to FIGS. 4A-4B, 7A-7C, 10A-10C and so on, that may sequentially unload and reload substrates from and to each process chamber 103. For example, when implemented with a triple twin blade robot, the robot may carry four (4) unprocessed substrates on four of six end effectors. Two end effectors are empty. The empty end effectors may retrieve two processed substrates from two substrate supports 110 in a first one of the process chambers 103. The robot then rotates the blades and places two unprocessed substrates on the empty substrate supports in the first process chamber 103. Using the empty end effectors, the robot then retrieves the remaining two processed substrates from the remaining two substrate supports 110. The robot then rotates and places two unprocessed substrates on the two empty substrate supports 110. After retrieving all of the processed substrates, the robot then returns to the load lock 109A to exchange the processed substrates with unprocessed substrates two at a time. The robot 102 may then proceed to unload/reload the process chambers 103. The use of a triple twin blade robot to swap substrates within a process chamber having four substrate supports enables the exchange to occur within a single cycle, thereby reducing swapping time and increasing throughput.

Figure 2A:
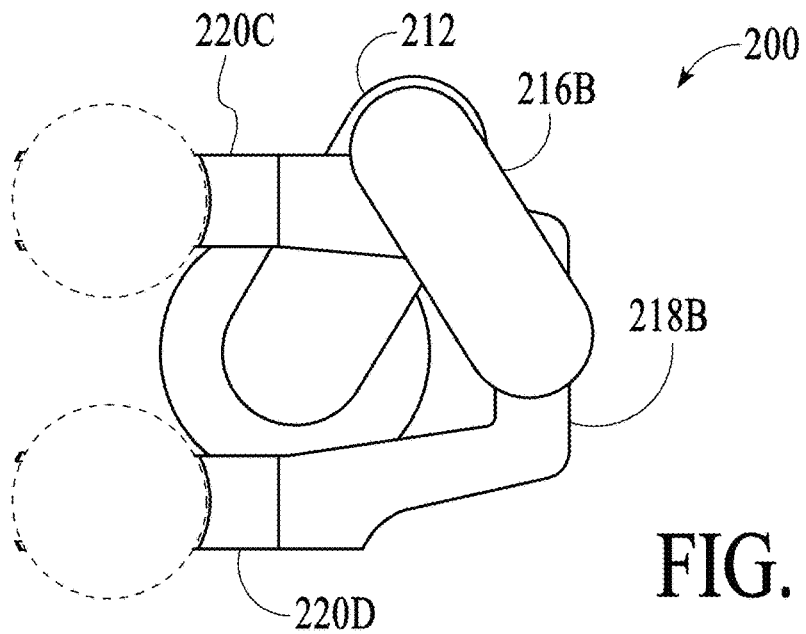
FIG. 2A illustrates an above view of a robot apparatus including two independently-controllable forearms each having an independently rotatable twin wrist member according to one or more embodiments.
Figure 2B:
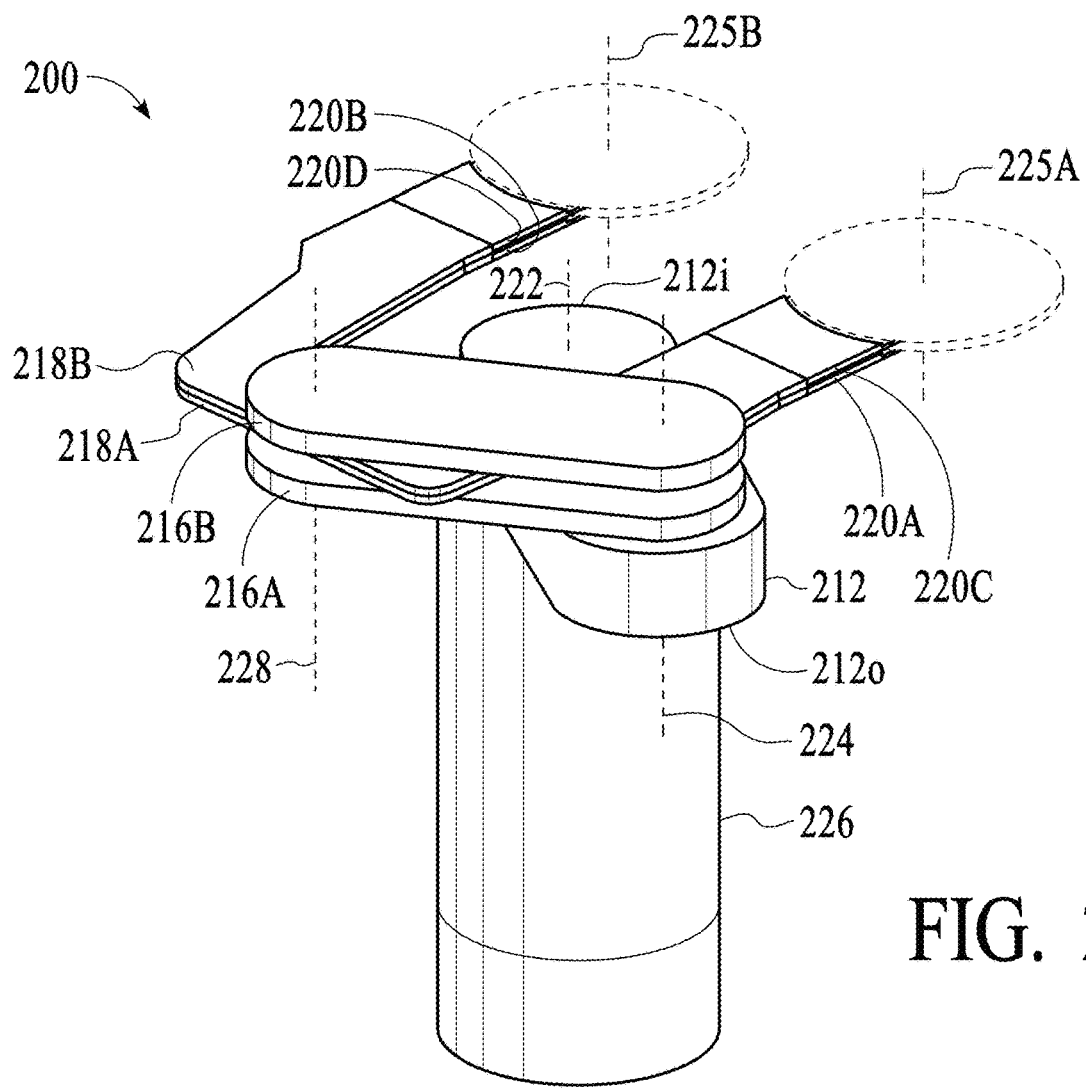
FIG. 2B illustrates a perspective view of a robot apparatus including two independently-controllable forearms each having an independently rotatable twin wrist member according to one or more embodiments.
Figure 2C:
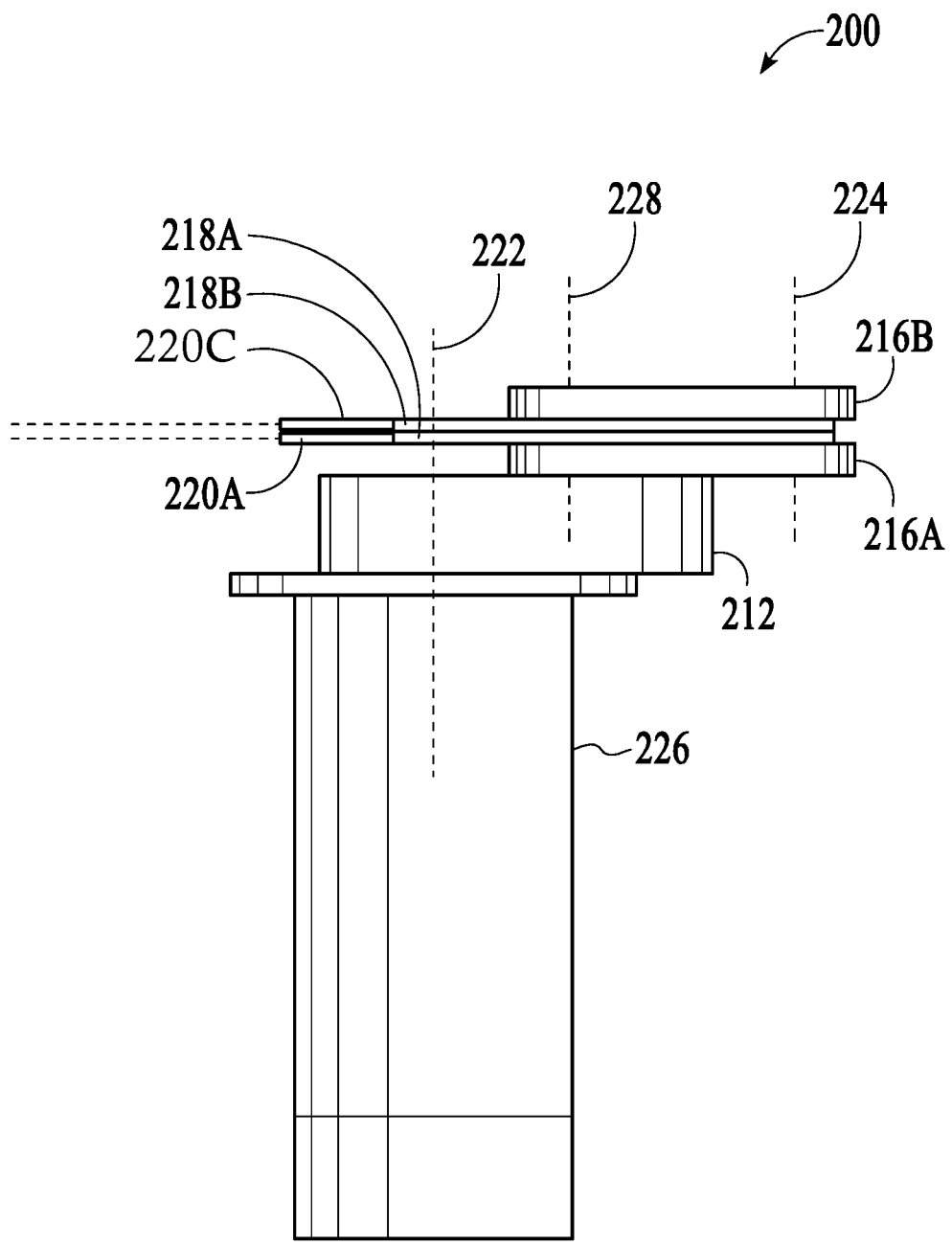
FIG. 2C illustrates a side plan view of a robot apparatus including two independently-controllable forearms each having an independently rotatable twin wrist member according to one or more embodiments.

FIG. 2A illustrates an above view of a robot apparatus including two independently-controllable forearms each having an independently rotatable twin wrist member according to one or more embodiments. FIG. 2B illustrates a perspective view of a robot apparatus including two independently-controllable forearms each having an independently rotatable twin wrist member according to one or more embodiments. FIG. 2C illustrates a side plan view of a robot apparatus including two independently-controllable forearms each having an independently rotatable twin wrist member according to one or more embodiments.

In an embodiment, robot apparatus 200 corresponds to robot apparatus 102 of FIG. 1. In such embodiments, the robot apparatus 200 may be configured and adapted to transfer substrates between various process chambers 103 and/or to exchange substrates at one or more load lock apparatus 109A, 109B, for example. In the depicted embodiment of FIG. 1, two load lock apparatus 109A, 109B are shown. However, the robot apparatus 200 could be used with only one load lock apparatus or more than two load lock apparatus.

The robot apparatus 200 has an arm 212 including an inboard end 212*i* and outboard end 212O. The inboard end 212*i* is configured to be rotatable about a shoulder axis 222 by an arm drive motor of a drive motor assembly 226. A drive assembly of driving and driven pulleys (e.g., circular or non-circular) and transmission members are included within arm 212. The drive assembly can be any suitable pulley transmission assembly known to those of ordinary skill in the art. Arm 212 can have a center-to-center length of L1, wherein the centers of the length L1 are the shoulder axis 222 and outboard axis 224 (a.k.a. the elbow axis).

The robot apparatus 200 as shown includes two forearms 216A, 216B coupled to the outboard end 212O of the arm 212 opposite from the inboard end 212*i*. The forearms 216A, 216B each has a center-to-center length L2 wherein the centers of the length L2 for the forearms 216A, 216B are the outboard axis 224 (a.k.a. the elbow joint of the forearm or the elbow axis of the forearm) and a first wrist axis and a second wrist axis, respectively, corresponding to axis 228 (i.e., when the robot is in a zeroed and folded configuration). Each forearm 216A, 216B is independently rotatable about a common shaft at the outboard axis 224 through the commanded action of a first drive motor, and a second drive motor, respectively. The first drive motor and second drive motor are commanded by a suitable control signal received from a controller (not shown). The controller can be any suitable processor, memory, electronics and/or drivers capable of processing control instructions and carrying out motion of forearm 216A, 216B.

Coupled to each forearm 216A, 216B via a first wrist shaft and a second wrist shaft, respectively, is an independently rotatable twin wrist member 218A, 218B each having two legs attached to which is an end effector 220A-220D. As shown in the illustrated embodiments of FIGS. 2A-2C, each wrist member 218A, 218B has two end effectors 220A, 220B and 220C, 220D, respectively, in a lateral arrangement, which may also be referred to as a butterfly arrangement. Each wrist member 218A, 218B is independently rotatable about a first wrist axis and a second wrist axis, respectively, through the commanded action of a first drive motor and a second drive motor, respectively. When in a zeroed and folded configuration as shown in the illustrated embodiment of FIGS. 2A-2C, the first wrist axis is aligned with the second wrist axis as represented by axis 228. The first drive motor and second drive motor are commanded by a suitable control signal received from a controller (not shown). The controller can be any suitable processor, memory, electronics and/or drivers capable of processing control instructions and carrying out motion of the wrist member 218A, 218B. The wrist members 218A, 218B are configured to rotate about a nominal center or midpoint located halfway between each leg as indicated by axis 228 shown in the illustrated embodiment.

A nominal center 225A, 225B of end effectors 220A-220D is where a substrate will rest on each of the end effectors 220A-220D when nominally positioned thereon, as depicted. Restraining features restrain the location of the substrates on the end effectors 220A-220D within limits. In the depicted embodiment, the wrist members 218A, 218B and the end effectors 220A-220D are separate interconnected members. However, it should be understood that each forearm member and end effector may be integrally formed in some embodiments and constitute one unitary component. In the depicted embodiment, each of the forearm members 216A, 216B may include a corresponding orientation adjuster at the end thereof to allow for fine orientation adjustments (e.g., adjustments for droop and/or tilt) to each of the end effectors 220A-220D. The orientation adjusters can use screws and/or shims to accomplish end effector attitude adjustments.

It should be apparent that the first forearm 216A is configured for independent rotation relative to arm 212 about a common shaft at the outboard axis 224. The first forearm 216A is coupled to a first wrist member 218A at a nominal center corresponding with the first wrist axis about which the wrist member 218A rotates. Wrist member 218A has two legs, each of which is coupled to a first end effector 220A and a second end effector 220B. In embodiments, wrist member 218A is in the shape of a "U" with the first wrist shaft at the first wrist axis positioned at the bottom center of the "U," and the first end effector 220A at a first distal end of one of the arms of the "U" and the second end effector 220B at a second distal end of the other one of the arms of the "U." The first forearm member 216A may be positioned directly below the second forearm member 216B with the first and second end effectors 220A, 220B correspondingly below the third and fourth end effectors 220C, 220D. Likewise, the second forearm 216B may be configured for independent rotation relative to the arm 212 about the outboard axis 224. The second forearm 216B is coupled to a second wrist member 218B at a nominal center corresponding with the second wrist axis about which the wrist member 218B rotates. Wrist member 218B has two legs, each of which is coupled to a third end effector 220C and a fourth end effector 220D. In embodiments, wrist member 218A is in the shape of a "U" with the first wrist shaft at the first wrist axis positioned at the bottom center of the "U," and the first end effector 220A at a first distal end of one of the arms of the "U" and the second end effector 220B at a second distal end of the other one of the arms of the "U."

As can be seen in FIGS. 2A-2C, the first and second end effectors 220A, 220B lie directly beneath the third and fourth end effectors 220C, 220D, respectively, when configured in a folded and zeroed configuration (e.g., in a vertically stacked configuration). This folded and zeroed configuration is the neutral configuration and the forearms 216A, 216B can be rotated approximately +/−170 degrees from this orientation, for example. As further shown in FIGS. 2A-2C, in embodiments, the first wrist member 218A is positioned above the first forearm 216A and between the first and second forearms 216A, 216B. The second wrist member 218B is positioned beneath the second forearm 216B between the first wrist member 218A and the second forearm 216B.

If the first forearm assembly, comprised of forearm 216A, wrist 218A and end effectors 220A, 220B, extends into a process chamber 103, then the second forearm assembly, comprised of forearm 216B, wrist 218B and end effectors 220C, 220D, may rotate about the shoulder axis 222. Correspondingly, if the second forearm assembly extends into a process chamber 103, then the first forearm assembly may rotate about the shoulder axis 222.

Figure 3A:
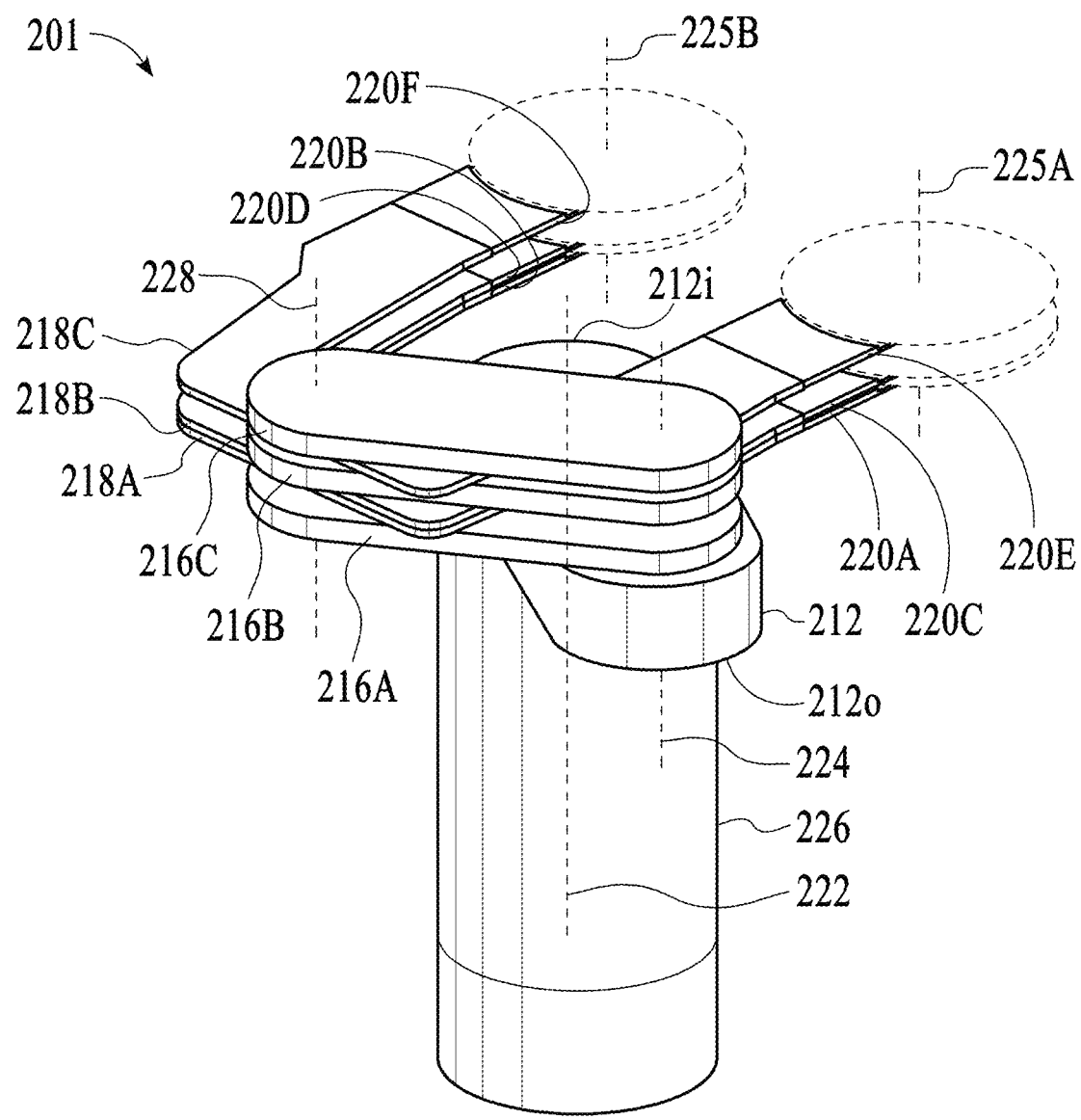
FIG. 3A illustrates a perspective view of a robot apparatus including three independently-controllable forearms each having an independently controllable twin wrist member according to one or more embodiments.
Figure 3B:
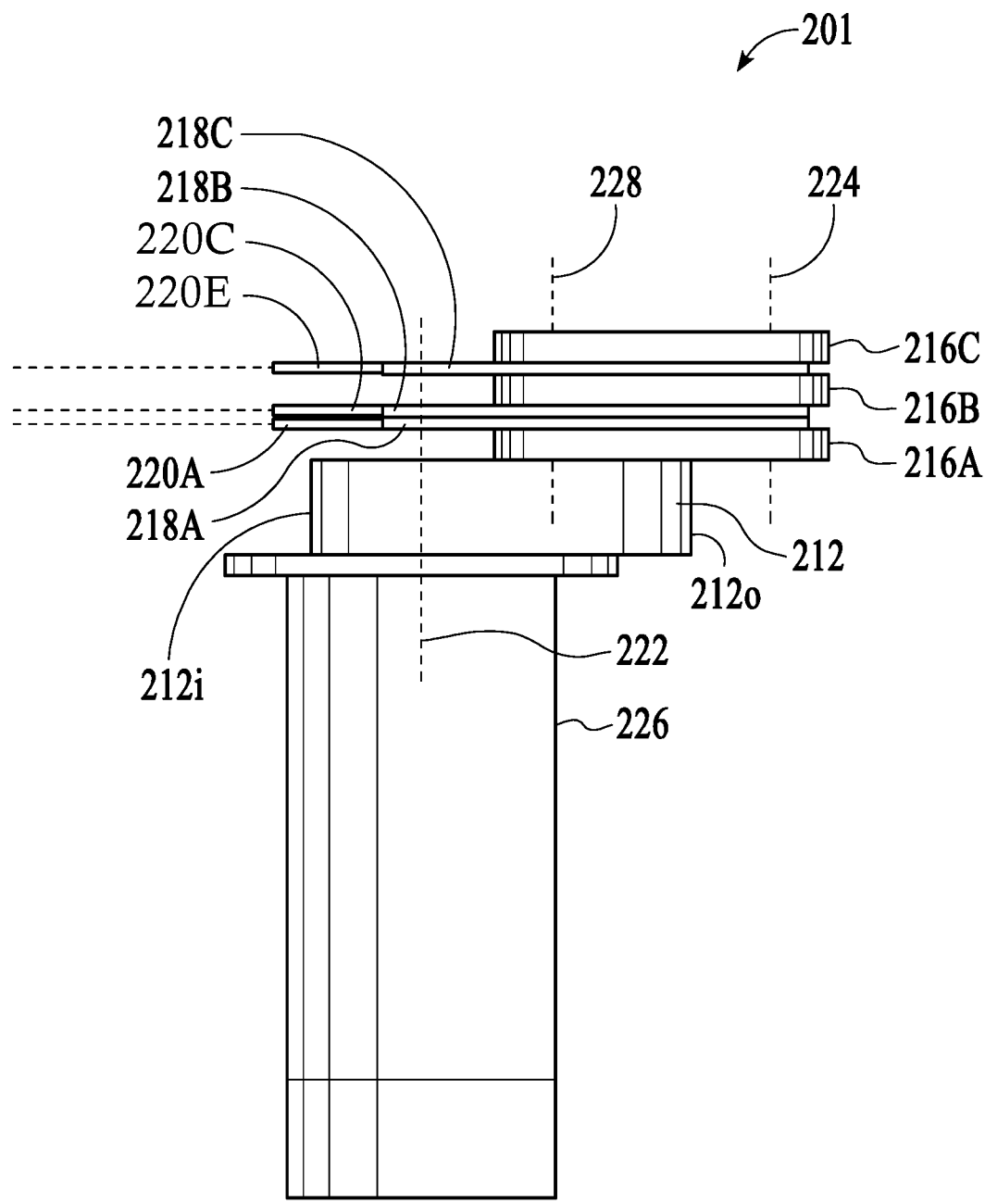
FIG. 3B illustrates a side plan view of a robot apparatus including three independently-controllable forearms each forearm each having an independently controllable twin wrist member according to one or more embodiments.

FIGS. 3A and 3B illustrate a robot 201 having the same configuration as robot 200, but with an additional forearm 216C, wrist member 218C and attached end effectors 220E, 220F. As shown, the wrist members each approximately have a U shape, and comprises a first wrist shaft positioned at a bottom center of the U shape, a first end effector positioned at a first distal end of the U shape and a second end effector positioned at a second distal end of the U shape. The wrist members may be rigid bodies, and the relative positions of the first end effector and second end effector may be fixed for each twin wrist member.

Robot 201 may correspond to robot 102 in FIG. 1 and may be suitable for use with multi-substrate process chambers 103, for example, having four substrate supports. As shown in the illustrated embodiment of FIGS. 3A and 3B, forearm 216C is positioned above forearm 216B and is rotatable about axis 224 via the common shaft. Wrist member 218C is positioned beneath forearm 216C and above forearm 216B and is rotatable about a third wrist axis the corresponds to axis 228 in FIGS. 3A and 3B. As shown in FIG. 3B, the pitch (e.g., a spacing of 30 mm or 100 mm) between the wrist members 218B, 218C is greater than the pitch (e.g., a spacing of 15 mm or 50 mm) between wrist members 218A, 218B. In embodiments, the pitch between forearms 216A, 216B may be greater than the pitch between the forearms 216B, 216C. In embodiments, the pitch between the forearms 216A-216C and the wrist members 218A-218E may be the same.

Load locks 109A, 109B may include a plurality of substrate supports in two vertical rows (e.g., two on top of two). In embodiments, a vertical spacing between end effectors 220A, 220B and end effectors 220C, 220D equals a first vertical pitch and a vertical spacing between end effectors 220C, 220D and end effectors 220E, 220F equals a second vertical pitch. The first vertical pitch may equal the vertical spacing between an upper load lock support and a lower load lock support in load lock 109A (for example). The second vertical pitch may equal the vertical spacing between an upper load lock support and a lower load lock support of the second load lock 109B. In embodiments, the first vertical pitch is less than the second vertical pitch, for example, the second vertical pitch may be approximately twice the first vertical pitch. In embodiments, the first load lock may be positioned above the second load lock. The first load lock may be configured to receive end effectors 220A-220D. In embodiments, the second load lock is configured to receive end effectors 220A, 220B and 220E, 220F, or 220C, 220D and 220E, 220F. In embodiments, end effectors 220A, 220B and 220E, 220F are spaced to put and get substrates to and from the upper load lock support and the lower load lock support of the second load lock. In embodiments, end effectors 220C, 220D and 220E, 220F and 220A, 220B and 220C, 220D are spaced to put and get substrates to and from an upper load lock support and a lower load lock support of the first load lock.

In further embodiments, the spacing between the wrist members 218B, 218C may be at an active heating pitch (e.g., 30 mm or 100 mm) and the spacing between the first and second wrist members 218A, 218B may be at a passive cooling pitch (e.g., 15 mm or 50 mm). For example, a batch load lock apparatus may include substrate temperature control capability such as active heating, active cooling, or both. The batch load lock apparatus may include the ability to preheat substrates prior to transferring them to the process chambers 103 and may include the ability to cool the substrates after returning from the process chambers and being transferred back to the factory interface. For example, using robot 201, two unprocessed substrates may be simultaneously retrieved by two end effectors, for example, 220E, 220F, from heater pedestals at a 30 mm or 100 mm pitch. Further, two processed substrates may be placed by end effectors 220C, 220D on two cooling pedestals at a 15 mm or 50 mm pitch. In embodiments, the pitch between the wrist members and end effectors may be reversed. For example, the pitch between wrist members 218B, 218C may be less than the spacing between wrist members 218A and 218B. In embodiments, the pitch between each of the forearms 216A-216C is the same.

Figure 3C:
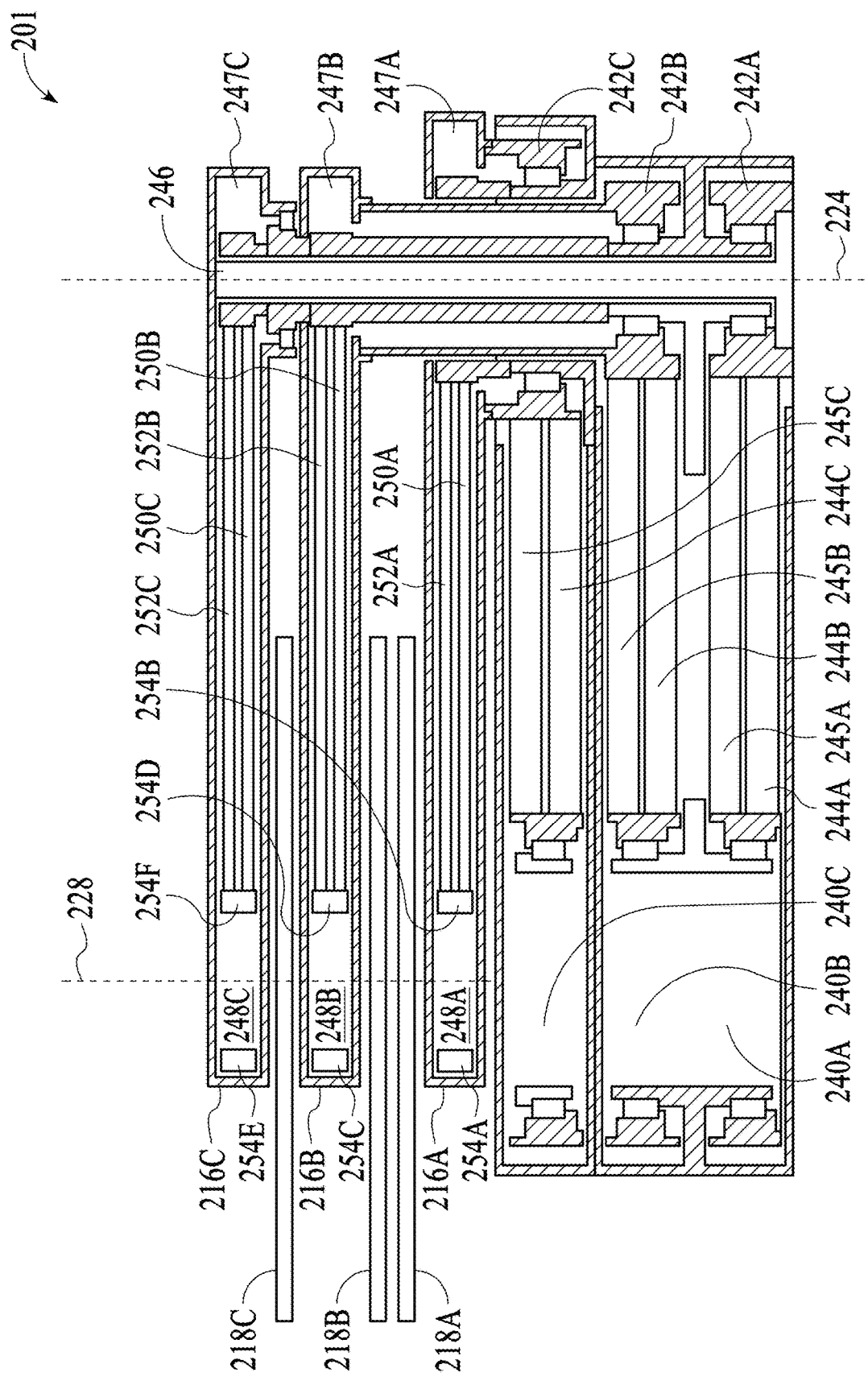
FIG. 3C illustrates transmission assembly of a robot apparatus according to one or more embodiments.

FIG. 3C illustrates an example embodiment of a drive assembly for rotating forearms 216A-216C and wrists 218A-218C of robot 201 according to embodiments herein. As illustrated in FIG. 3C, the transmission assembly for rotating the first forearm 216A includes a first driving pulley 240A and a first driven pulley 242A. The first driving pulley 240A is positioned at the inboard end 212*i* of arm 212 and the first driven pulley 242A is positioned at the outboard end 212o of arm 212. A pair of belts 244A, 245A wrapped about the first driving pulley 240A and the first driven pulley 242A drive the first driven pulley 242A to rotate about common shaft 246 together with the first forearm 216A attached thereto. The second forearm 216B is coupled to common shaft 246 and is rotatable about axis 224 and shaft 246 by a second transmission assembly having a second driving pulley 240B and a second driven pulley 242B. The second driving pulley 240B is positioned at the inboard end 212*i* of arm 212 and the second driven pulley 242B is positioned at the outboard end 212o of arm 212 above the first driving pulley 240A and the first driven pulley 242A, respectively. A pair of belts 244B, 245B wrapped about the second driving pulley 240B and the second driven pulley 242B drive the second driven pulley 242B to rotate about common shaft 246 together with the second forearm 216B attached thereto. The third forearm 216C is coupled to common shaft 246 and is rotatable about axis 224 and shaft 246 by a third transmission assembly having a third driving pulley 240C and a third driven pulley 242C. The third driving pulley 240C is positioned at the inboard end 212*i* of arm 212 and the third driven pulley 242C is positioned at the outboard end 212o of arm 212 above the second driving pulley 240B and the second driven pulley 242B, respectively. A pair of belts 244C, 245C wrapped about the third driving pulley 240C and the third driven pulley 242C drive the third driven pulley 242C to rotate about common shaft 246 together with the third forearm 216C attached thereto.

As illustrated in FIG. 3C, the transmission assembly for rotating the first wrist member 218A includes a first driving pulley 247A and a first driven pulley 248A. The first driving pulley 247A is positioned at the outboard end 212o of arm 212 and the first driven pulley 248A is positioned at rotational axis 228. A pair of belts 250A, 252A wrapped about the first driving pulley 247A and the first driven pulley 248A drive the first driven pulley 248A to rotate about axis 228 together with the first wrist member 218A attached thereto. The first driven pulley 248A includes a pair of bearings 254A, 254B to facilitate rotation of the first driven pulley 248A. Rotation of the second wrist member 218B includes a second driving pulley 247B and a second driven pulley 248B. The second driving pulley 247B is positioned at the outboard end 212o of arm 212 and the second driven pulley 248B is positioned at rotational axis 228. A pair of belts 250B, 252B wrapped about the second driving pulley 247B and the second driven pulley 248B drive the second driven pulley 248B to rotate about axis 228 together with the second wrist member 218B attached thereto. The second driven pulley 248B includes a pair of bearings 254C, 254D to facilitate rotation of the second driven pulley 248B. Rotation of the third wrist member 218C includes a third driving pulley 247C and a third driven pulley 248C. The third driving pulley 247C is positioned at the outboard end 212o of arm 212 and the third driven pulley 248C is positioned at rotational axis 228. A pair of belts 250C, 252C wrapped about the third driving pulley 247C and the third driven pulley 248C drive the third driven pulley 248C to rotate about axis 228 together with the third wrist member 218C attached thereto. The third driven pulley 248C includes a pair of bearings 254E, 254F to facilitate rotation of the third driven pulley 248C.

Figure 3D:
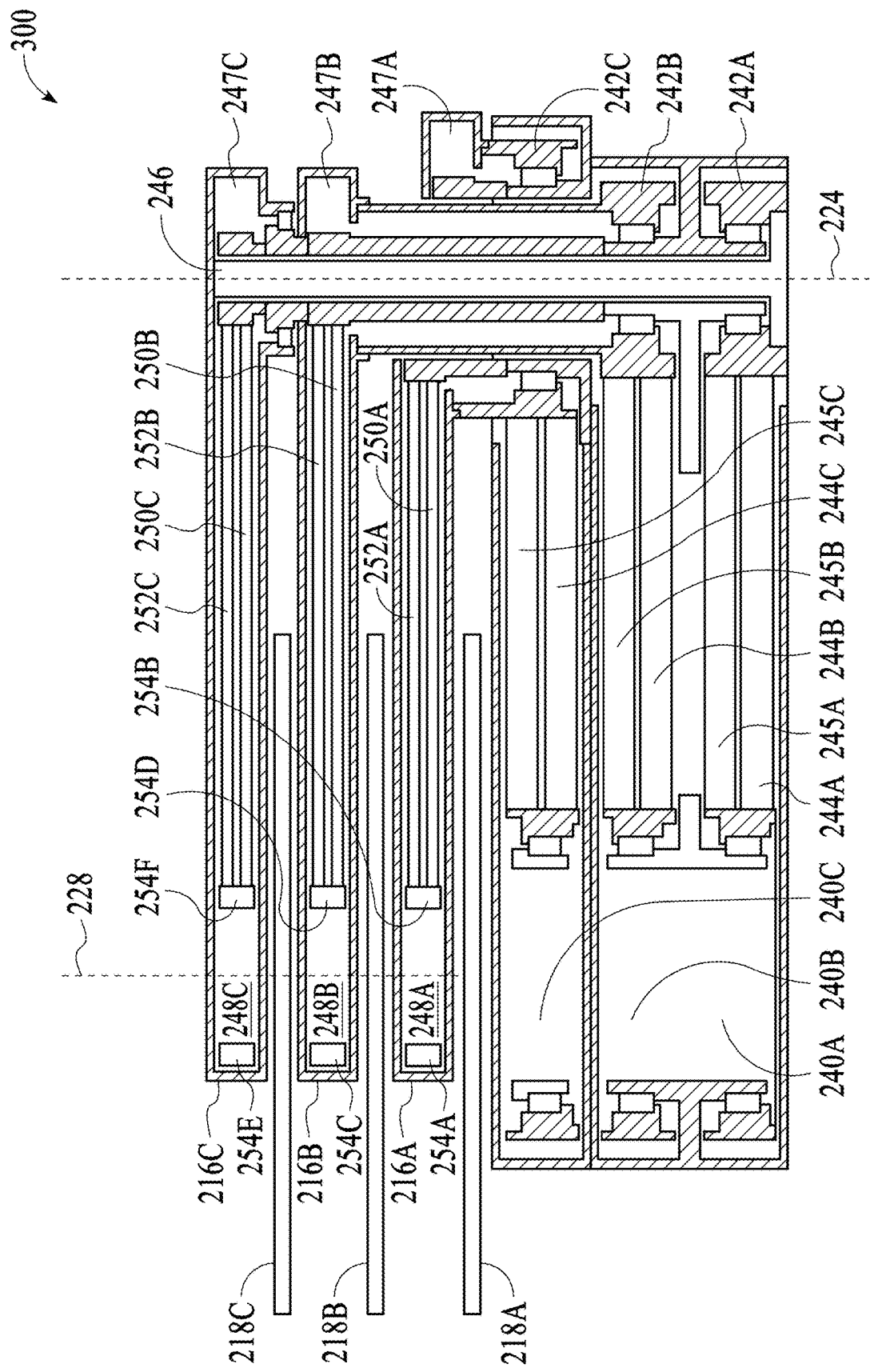
FIG. 3D illustrates transmission assembly of a robot apparatus according to one or more embodiments.

In an alternative embodiment of a transmission assembly 300 for a robot having three forearms 216A-216C and respective wrist members 218A-218C at equal pitches is shown in FIG. 3D. As shown in the illustrated embodiment, the pitch between the first wrist member 218A and the second wrist member 218B is the same as the pitch between the second wrist member 218B and the third wrist member 218C. The forearms 216A-216C and wrist members 218A-218C rotate by the pulley driving assemblies as described with respect to FIG. 3C.

Figure 3E:
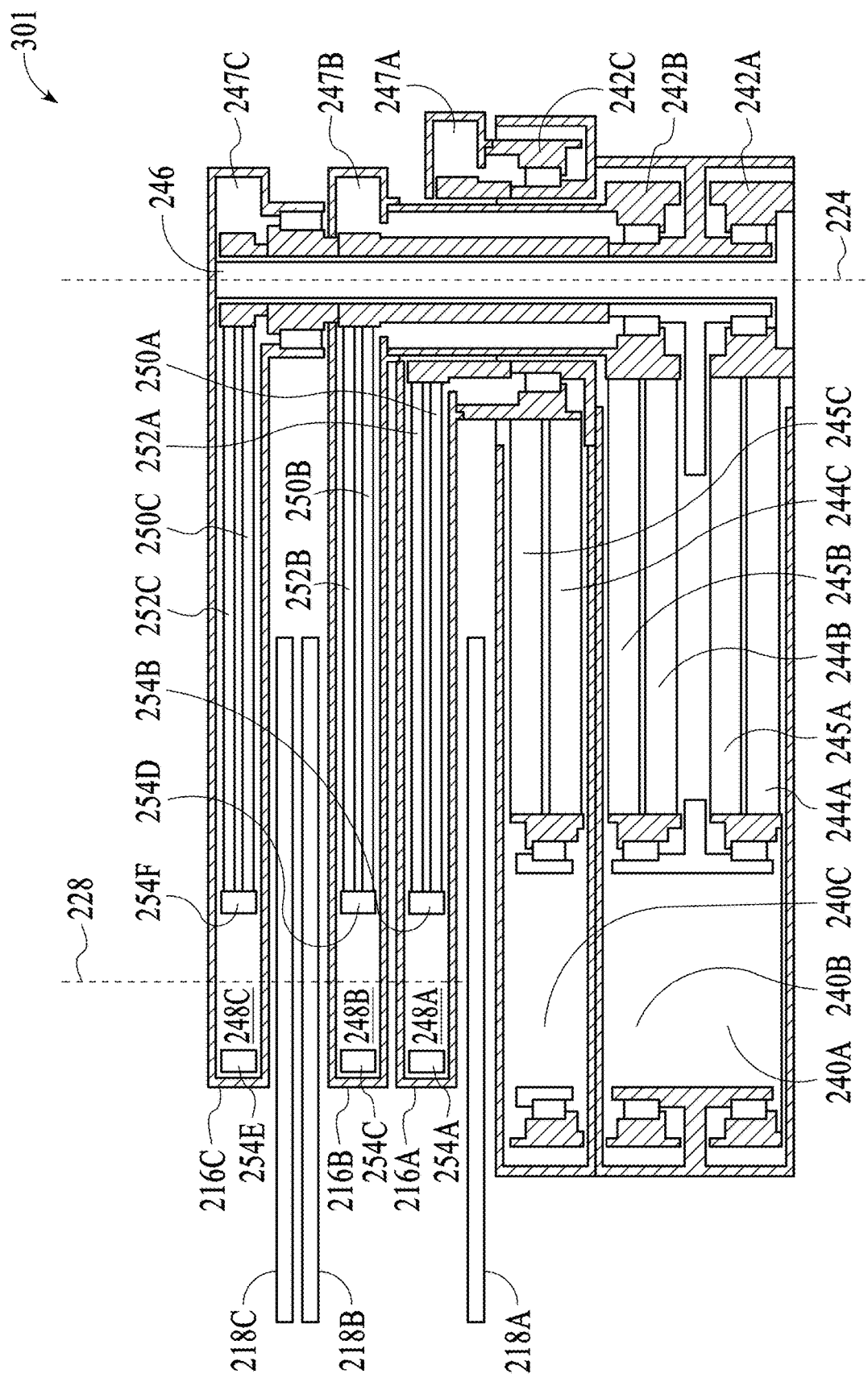
FIG. 3E illustrates transmission assembly of a robot apparatus according to one or more embodiments.

In another alternative embodiment of a transmission assembly 301 for a robot having three forearms 216A-216C and respective wrist members 218A-218C is shown in FIG. 3E. As shown in the illustrated embodiment, the pitch between the first wrist member 218A and the second wrist member 218B is the greater than the pitch between the second wrist member 218B and the third wrist member 218C. The forearms 216A-216C and wrist members 218A-218C rotate by the pulley driving assemblies as described with respect to FIG. 3C.

Figure 4A:
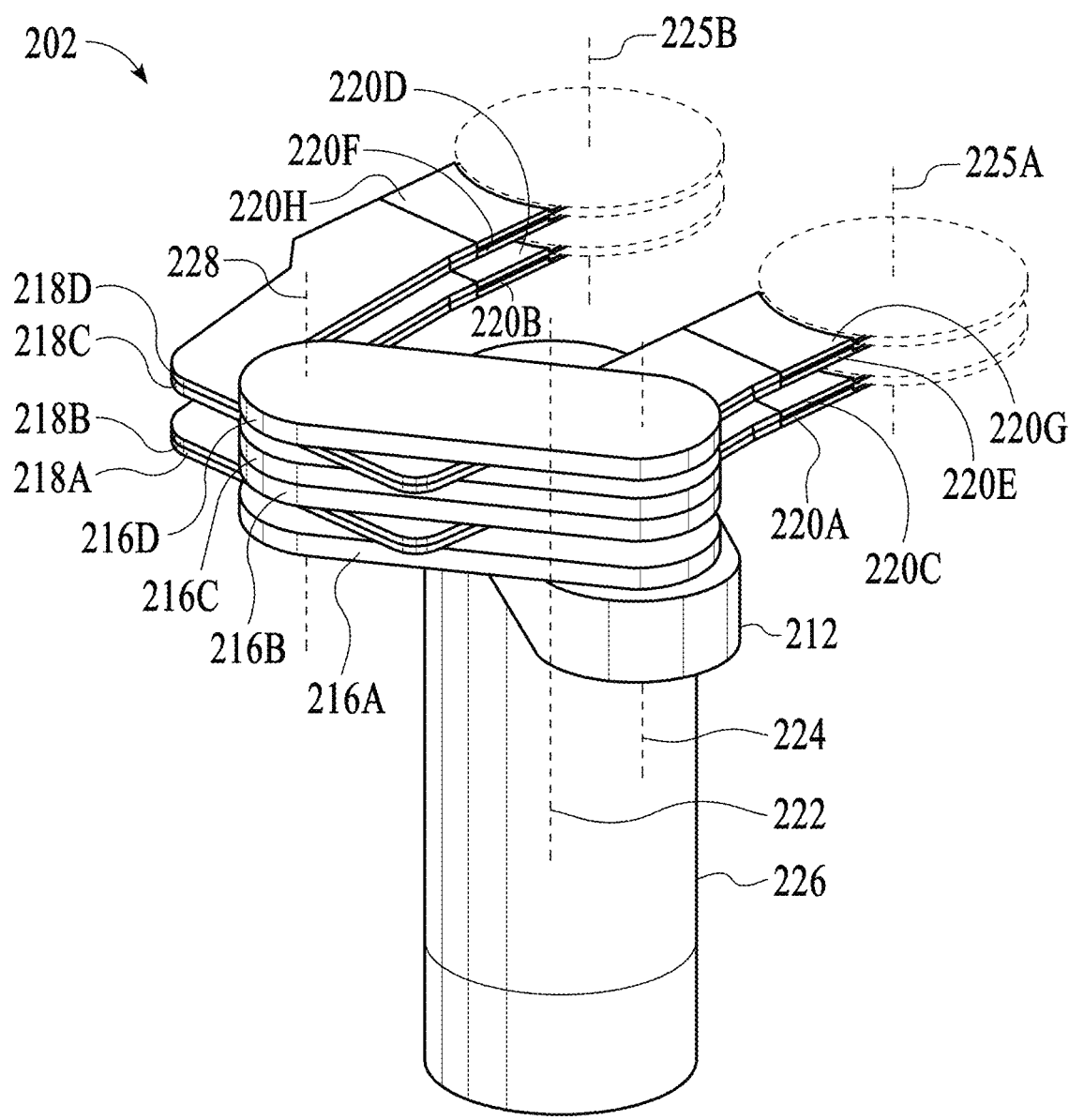
FIG. 4A illustrates a perspective view of a robot apparatus including four independently-controllable forearms each having an independently controllable twin wrist member according to one or more embodiments.
Figure 4B:
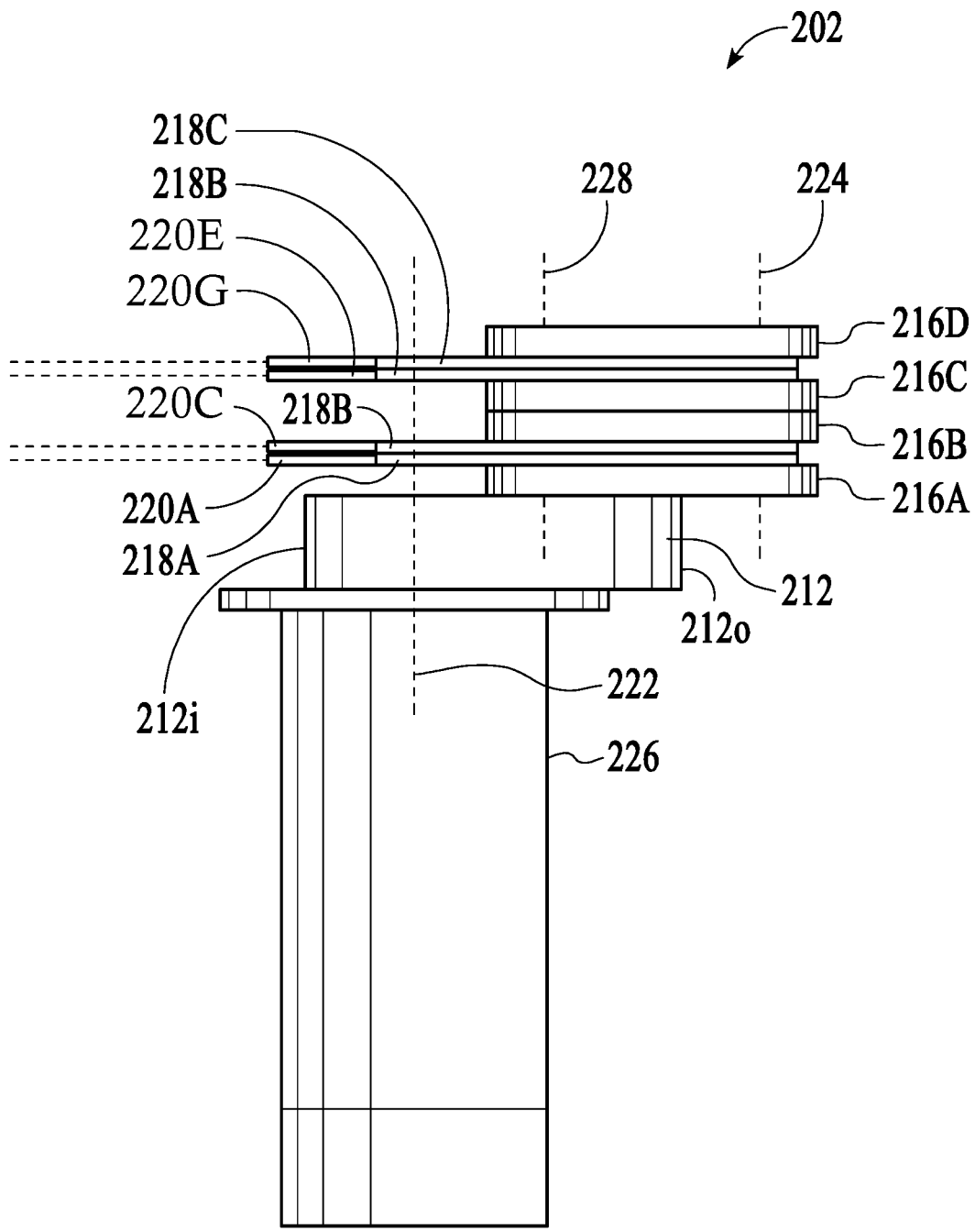
FIG. 4B illustrates a side plan view of a robot apparatus including four independently-controllable forearms each having an independently controllable twin wrist member according to one or more embodiments.

FIGS. 4A and 4B illustrate a robot 202 having the same configuration as robot 201, but with an additional forearm 216D, wrist member 218D and attached end effectors 220G, 220H. Robot 202 may correspond to robot 102 in FIG. 1 and may be suitable for use with multi-substrate process chambers 103, for example, having four to six substrate supports. As shown in the illustrated embodiment of FIGS. 4A and 4B, the fourth forearm 216D is positioned above the third forearm 216C and is rotatable about axis 224 via the common shaft. Fourth wrist member 218D is positioned beneath forearm 216D and above third wrist member 218C and is rotatable via a fourth wrist shaft about a fourth wrist axis corresponding to axis 228 in the illustrated embodiment. As shown in FIG. 4B, the spacing between the third and fourth wrist members 218C, 218D is less than the spacing between the second and third wrist members 218B, 218C. Likewise, the spacing between the third and fourth forearms 216C, 216D is greater than the spacing between the second and third forearms 216B, 216C. In embodiments, the spacing between the first and second wrist members 218A, 218B is the same as the spacing between the third and fourth wrist members 218C, 218D. In embodiments, the spacing between the forearms 216A-216C and wrist members 218A-218C may be the same.

As described with respect to robot 201 in FIGS. 3A and 3B, end effectors 220C, 220D and 220G, 220H may have a different pitch than end effectors 220A, 220B, 220E, 220F and may be configured to retrieve heated or cooled substrates. In embodiments, robot 202 may be configured to simultaneously retrieve four (4) unprocessed substrates from four (4) substrate supports in a load lock 109A using end effectors 220A-220D at a first pitch. Alternatively, the robot may simultaneously retrieve two (2) substrates and then raise or lower in a Z direction (i.e., up or down) to retrieve two additional substrates through the slit valve. Robot 202 may then move to a process chamber to retrieve processed substrates using end effectors 220E-220H at a second pitch and to place the four unprocessed substrates on the empty substrate supports using end effectors 220A-220D.

Robot 202 is suitable for use with multi-substrate process chambers, for example, having two (2) to six (6) substrate supports. In the use case shown in FIG. 1, the quadruple twin blade robot 202 may sequentially unload and reload substrates from and to process chambers 103 as shown having four (4) substrate supports or process chambers having six (6) substrate supports (not shown). For example, for process chambers having six (6) substrate supports, the robot 202 carrying six (6) unprocessed substrates on six (6) of the eight (8) end effectors 220A-220F (for example), has two empty end effectors 220G, 220H (for example). The empty end effectors 220G, 220H retrieve two processed substrates from two substrate supports in a first one of the process chambers. The robot 202 then rotates the blades and places two unprocessed substrates using end effectors 220A, 220B (for example) on the empty substrate supports in the first process chamber. Using the empty end effectors 220A, 220B, the robot 202 then retrieves two additional processed substrates from two additional substrate supports and places two unprocessed substrates using end effectors 220C, 220D on the empty substrate supports. Using the empty end effectors 220C, 220D, the robot 202 then retrieves two additional processed substrates from two additional substrate supports and places two unprocessed substrates using end effectors 220E, 220F on the empty substrate supports. The robot 202 then returns to the load lock 109A to exchange the processed substrates with unprocessed substrates two at a time. Using the empty end effectors 220E, 220F (for example), the robot 202 may retrieve two unprocessed substrates from two substrate supports within the load lock 109A and place two processed substrates on the empty substrate supports. The robot 202 may continue to swap unprocessed substrates with processed substrates two at a time until six end effectors 220A, 220B, 220E-220H (for example) hold unprocessed substrates and two end effectors 220C, 220D (for example) are empty. The robot 202 may then proceed to unload/reload the process chambers.

Figure 5A:
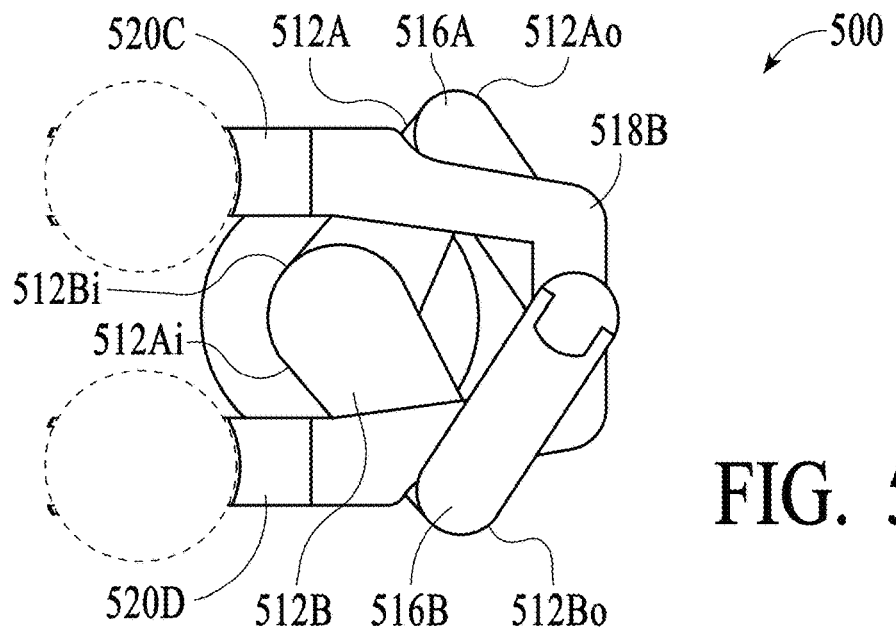
FIG. 5A illustrates an above view of a robot apparatus including two independently controllable arms each having an independently controllable forearm and each forearm having a twin wrist member according to one or more embodiments.
Figure 5B:
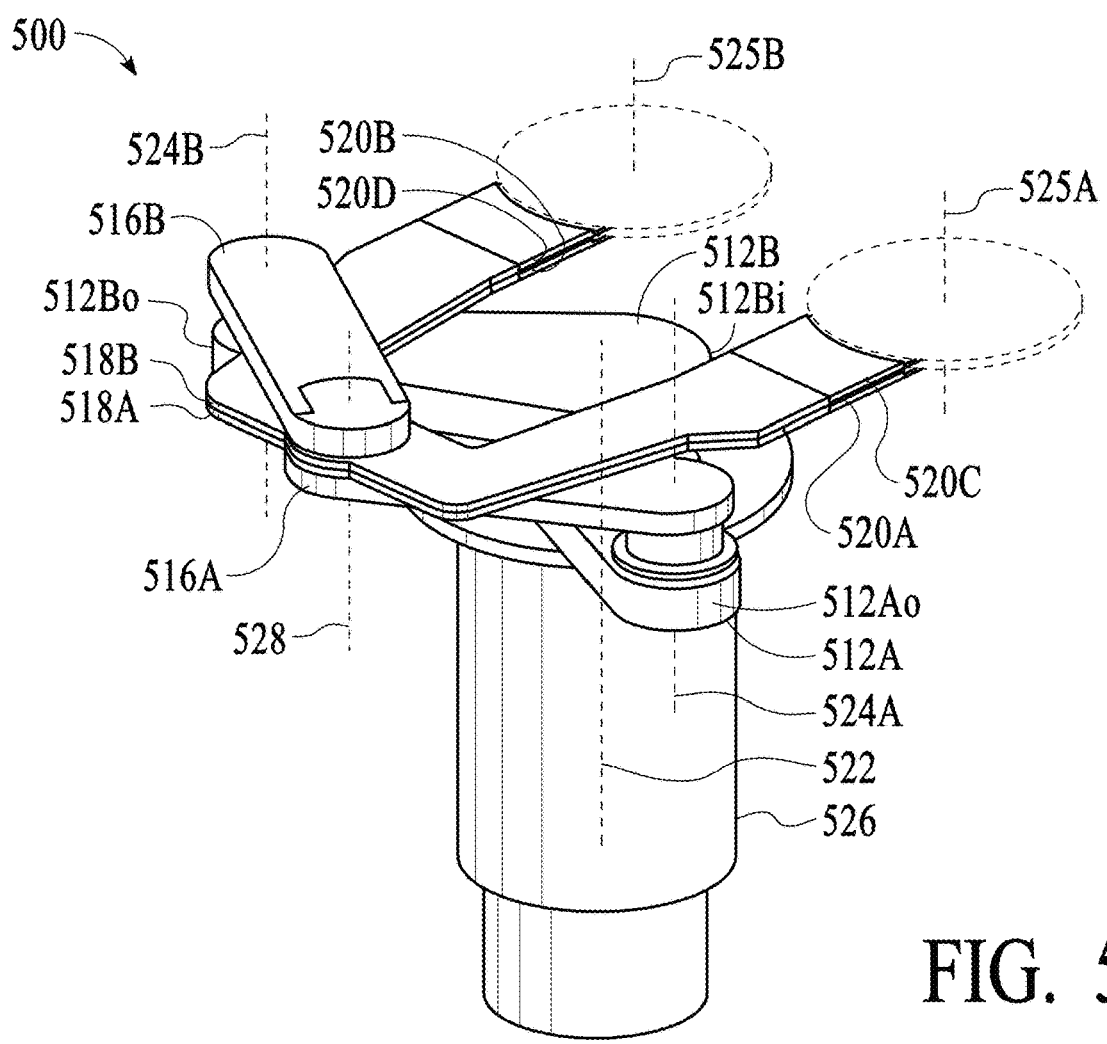
FIG. 5B illustrates a perspective view of a robot apparatus including two independently controllable arms each having an independently controllable forearm and each forearm having a twin wrist member according to one or more embodiments.
Figure 5C:
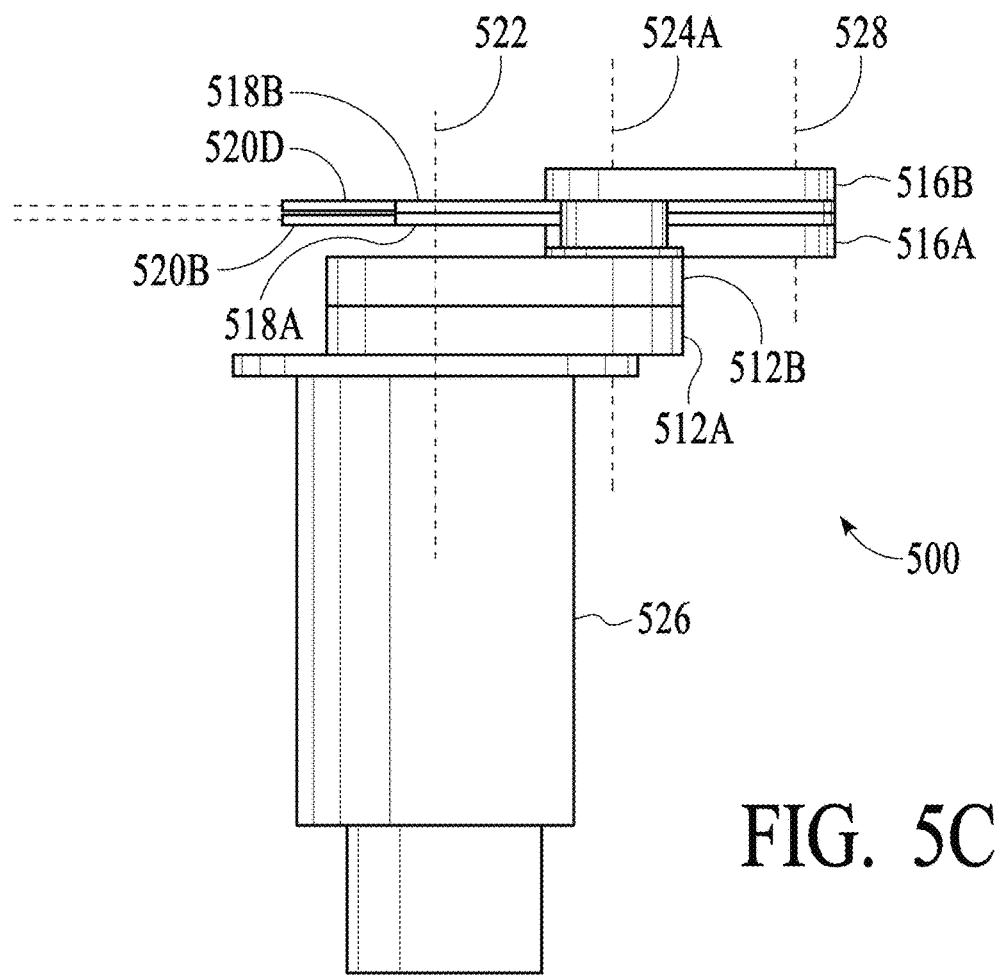
FIG. 5C illustrates a side view of a robot apparatus including two independently controllable arms each having an independently controllable forearm and each forearm having a twin wrist member according to one or more embodiments.
Figure 5D:
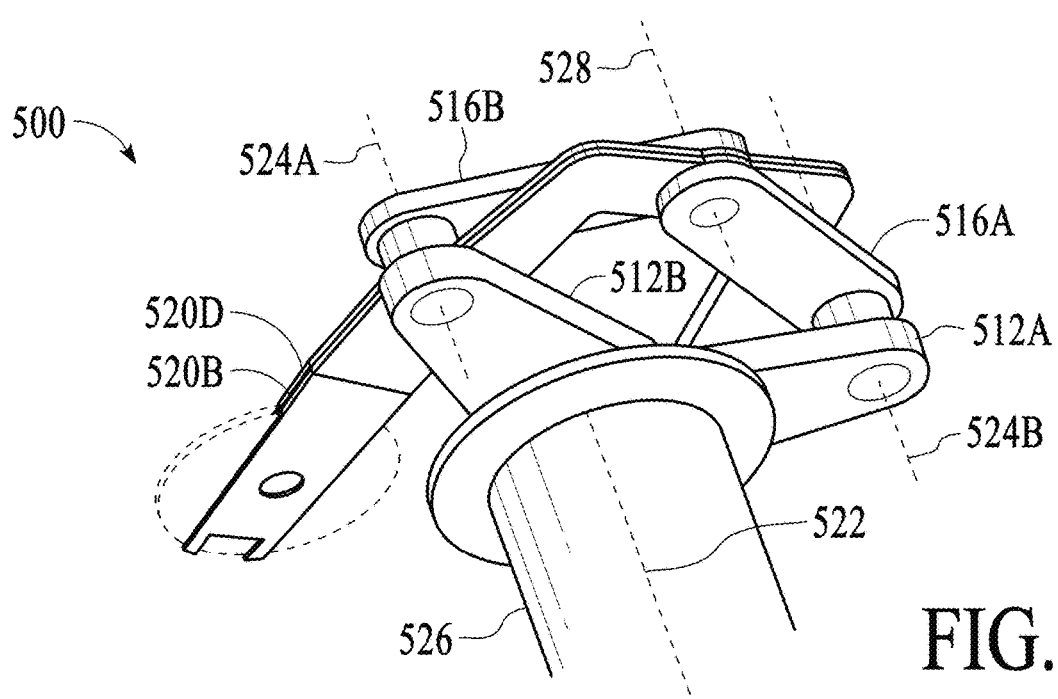
FIG. 5D illustrates a perspective view of the bottom side of a robot apparatus including two independently controllable arms each having an independently controllable forearm and each forearm having a twin wrist member according to one or more embodiments.
Figure 5E:
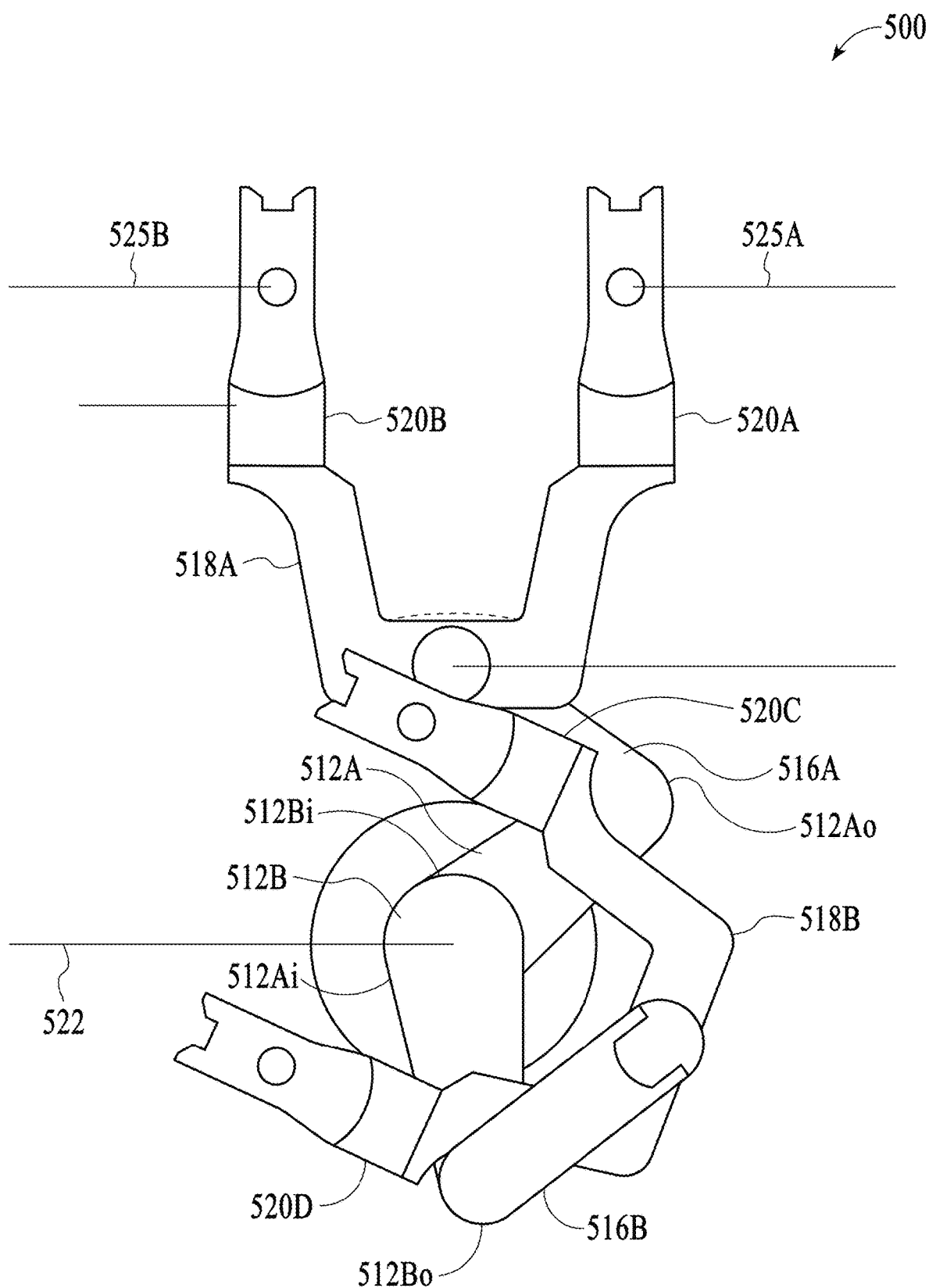
FIG. 5E illustrates an above view of the robot apparatus in an extended configuration according to one or more embodiments.

FIG. 5A illustrates an above view of a robot apparatus including two independently controllable arms each having an independently controllable forearm and each forearm having a twin wrist member according to one or more embodiments. FIG. 5B illustrates a perspective view of a robot apparatus including two independently controllable arms each having an independently controllable forearm and each forearm having a twin wrist member according to one or more embodiments. FIG. 5C illustrates a side view of a robot apparatus including two independently controllable arms each having an independently controllable forearm and each forearm having a twin wrist member according to one or more embodiments. FIG. 5D illustrates a perspective view of the bottom side of a robot apparatus including two independently controllable arms each having an independently controllable forearm and each forearm having a twin wrist member according to one or more embodiments. FIG. 5E illustrates an above view of the robot apparatus in an extended configuration according to one or more embodiments.

In an embodiment, robot apparatus 500 corresponds to robot apparatus 102 of FIG. 1. In such embodiments, the robot apparatus 500 may be configured and adapted to transfer substrates between various process chambers 103 and/or to exchange substrates at one or more load lock apparatus 109A, 109B, for example. In the depicted embodiment of FIG. 1, two load lock apparatus 109A, 109B are shown. However, the robot apparatus 500 could be used with only one load lock apparatus or more than two load lock apparatus.

The robot apparatus 500 has a first arm 512A and a second arm 512B each including an inboard end 512Ai, 512Bi and an outboard end 512Ao, 512Bo, respectively. The inboard ends 512Ai, 512Bi are configured to be rotatable about a shoulder axis 522 by an arm drive motor of a drive motor assembly 526. Drive assemblies of driving and driven pulleys (e.g., circular or non-circular) and transmission members are included within arms 512A, 512B. Each arm 512A, 512B can have a center-to-center length of L1, wherein the centers of the length L1 are the shoulder axis 522 and outboard axes 524A, 524B.

Robot apparatus 500 as shown includes two forearms 516A, 516B coupled to the outboard ends 512Ao, 512Bo of arms 512A, 512B opposite from inboard ends 512Ai, 512Bi. The forearms 516A, 516B each has a center-to-center length L2 wherein the centers of the length L2 for the forearms 516A, 516B are the outboard axes 524A, 524B (a.k.a. the elbow joints of the forearms) and axis 528 (a.k.a. the wrist axis of each wrist member). Each forearm 516A, 516B is independently rotatable about a shaft at the respective outboard axes 524A, 524B through the commanded action of a first forearm drive motor, and a second forearm drive motor, respectively. The first drive motor and second drive motor are commanded by a suitable control signal received from a controller (not shown). The controller can be any suitable processor, memory, electronics and/or drivers capable of processing control instructions and carrying out motion of forearm 516A, 516B.

Coupled to each forearm 516A, 516B is an independently rotatable twin wrist member 518A, 518B, respectively, each having two legs attached to which is an end effector 520A-520D. In embodiments, wrist members 518A, 518B are in the shape of a "U" with the first and second wrist shafts at the first and second wrist axes, respectively, positioned at the bottom center of the "U," and the first end effectors 520A, 520C at a first distal end of one of the arms of the "U" and the second end effector 520B, 520D at a second distal end of the other one of the arms of the "U." As shown in the illustrated embodiments of FIGS. 5A-5E, each wrist member 518A, 518B has two end effectors 520A, 520B and 520C, 520D, respectively, in a butterfly configuration. Each wrist member 518A, 518B is independently rotatable about a first wrist axis and a second wrist axis, respectively, via the commanded action of a first wrist drive motor and a second wrist drive motor, respectively. In the illustrated embodiment, the first wrist axis is located below the second wrist axis when the robot 500 is in a zeroed and folded configuration. The first wrist axis and the second wrist axis are aligned at axis 528 as shown in FIG. 5B. The first wrist drive motor and second wrist drive motor are commanded by a suitable control signal received from a controller (not shown). The controller can be any suitable processor, memory, electronics and/or drivers capable of processing control instructions and carrying out motion of the wrist member 518A, 518B. The wrist members 518A, 518B are configured to rotate about a nominal center at axis 528 located halfway between each leg.

A nominal center 525A, 525B of end effectors 520A-520D is where a substrate will rest on each of the end effectors when nominally positioned thereon, as depicted. Restraining features restrain the location of the substrates on the end effectors 520A-520D within limits. In the depicted embodiment, the wrist members 518A, 518B and the end effectors 520A-520D are separate interconnected members. However, it should be understood that each forearm member and end effector may be integrally formed in some embodiments and constitute one unitary component. In the depicted embodiment, each of the forearm members 516A, 516B may include a corresponding orientation adjuster at the end thereof to allow for fine orientation adjustments (e.g., adjustments for droop and/or tilt) to each of the end effectors 520A-520D. The orientation adjusters can use screws and/or shims to accomplish end effector attitude adjustments.

It should be apparent that the first forearm 516A is configured for independent rotation relative to arm 512A about a shaft at outboard axis 524A. The first forearm 516A is coupled to a first wrist member 518A at a nominal center corresponding with the first wrist axis about which the wrist member 518A rotates. Wrist member 518A has two legs, each of which is coupled to a first end effector 520A and a second end effector 520B. The first forearm member 516A may be positioned directly below the second forearm member 516B with the first and second end effectors 520A, 520B correspondingly below the third and fourth end effectors 520C, 520D. Likewise, the second forearm 516B may be configured for independent rotation relative to the arm 512B about the outboard axis 524B. The second forearm 516B is coupled to a second wrist member 518B at a nominal center corresponding with the second wrist axis about which the wrist member 518B rotates. Wrist member 518B has two legs, each of which is coupled to a third end effector 520C and a fourth end effector 520D.

As can be seen in FIGS. 5A-5E, the first and second end effectors 520A, 520B lie directly beneath the third and fourth end effectors 520C, 520D, respectively, when configured in a folded and zeroed configuration (e.g., in a vertically stacked configuration), as shown. Forearms 516A, 516B are at an angle of about 45° about axis 528 when in a zeroed, folded configuration and mirror arms 512A, 512B, also at an angle of about 45° about axis 522 in the zeroed, folded configuration. This folded and zeroed configuration is the neutral configuration and the forearms 516A, 516B can be rotated approximately +/−170 degrees from this orientation, for example. As further shown in FIGS. 5A-5E, in embodiments, the first wrist member 518A is positioned above the first forearm 516A and below the second forearm 516B. The second wrist member 518B is positioned below the second forearm 516B and above the first wrist member 518A.

In the use case shown in FIG. 1, robot 500 may sequentially unload and reload substrates from and to process chamber 103 or a process chamber containing two (2) substrates. For example, the robot 500 carrying two (2) unprocessed substrates on two of the four end effectors 520A, 520B (for example), has two empty end effectors 520C, 520D (for example). The empty end effectors 520C, 520D retrieve two processed substrates from two substrate supports 110 in a first one of the process chambers. The robot 500 then places two unprocessed substrates using end effectors 520A, 520B (for example) on the empty substrate supports in the first process chamber. Robot 500 may then return to load lock 109A to exchange the processed substrates with unprocessed substrates two at a time. Using the empty end effectors 520A, 520B (for example), the robot 500 may retrieve two unprocessed substrates from two substrate supports within the load lock 109A and place the two processed substrates on the empty substrate supports using end effectors 520C, 520D. Robot 500 may then proceed to unload/reload the process chambers.

Figure 6A:
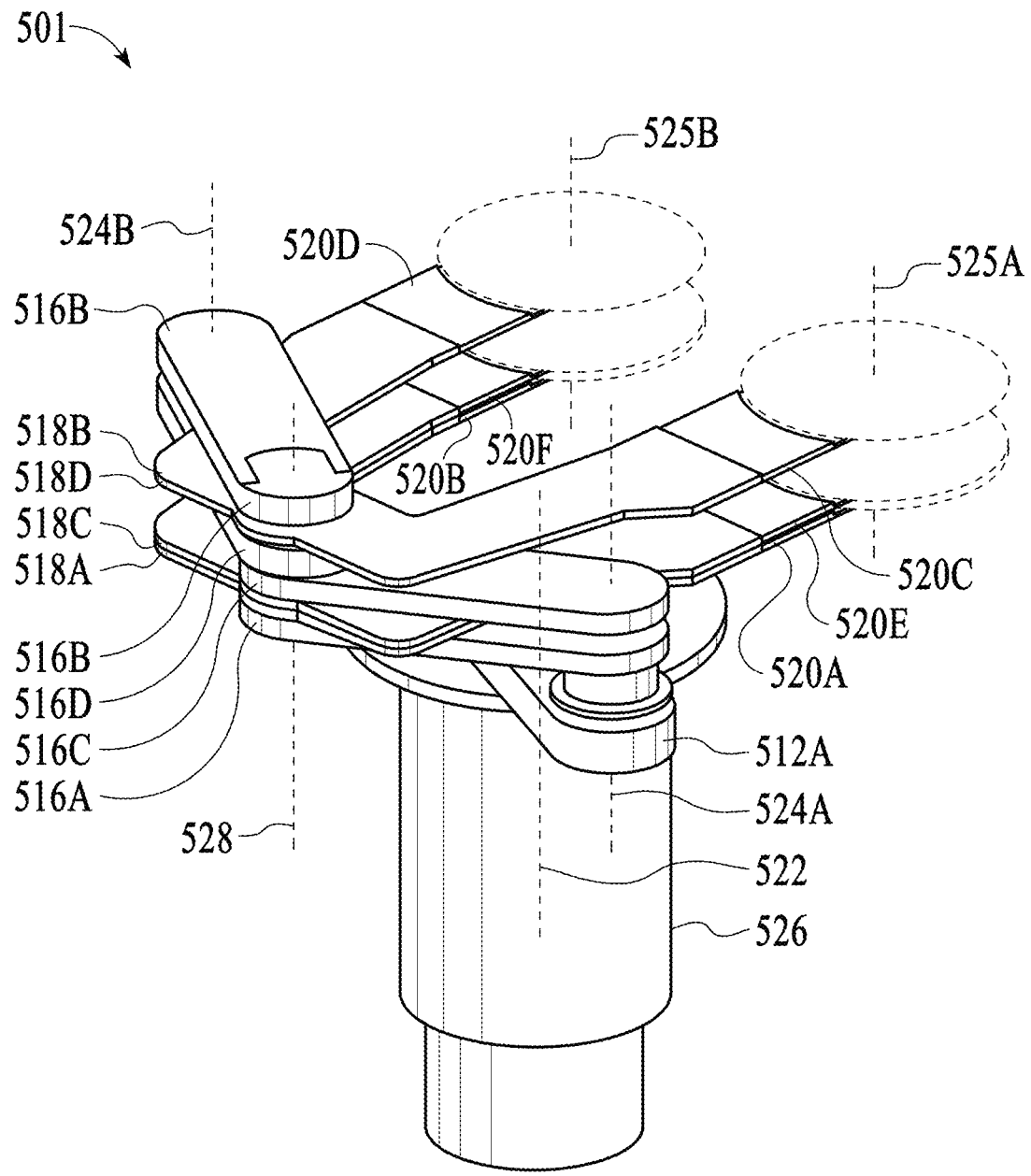
FIG. 6A illustrates a perspective view of a robot apparatus including two independently controllable arms, one arm having two independently controllable forearms and one arm having one independently controllable forearm, each forearm having a twin wrist member according to one or more embodiments.
Figure 6B:
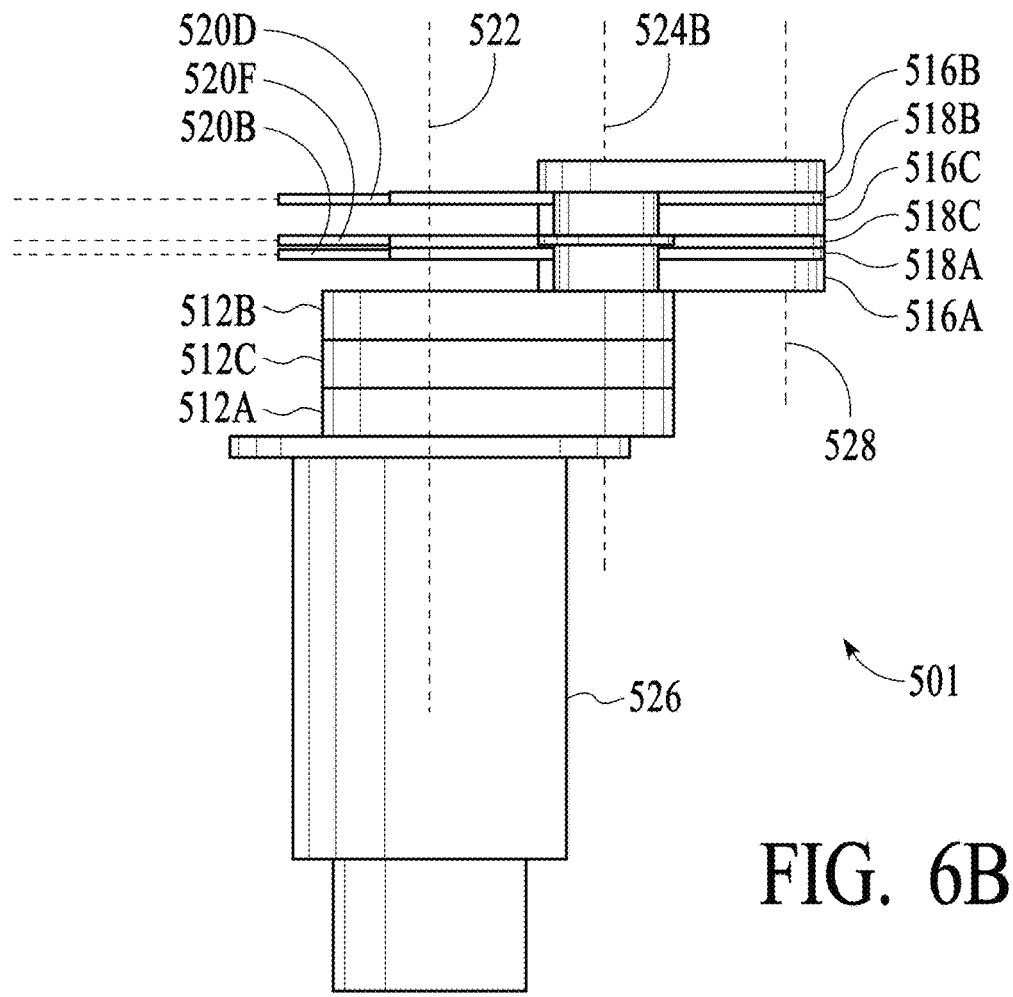
FIG. 6B illustrates a side plan view of a robot apparatus including two independently controllable arms, one arm having two independently controllable forearms and one arm having one independently controllable forearm, each forearm having a twin wrist member according to one or more embodiments.
Figure 6C:
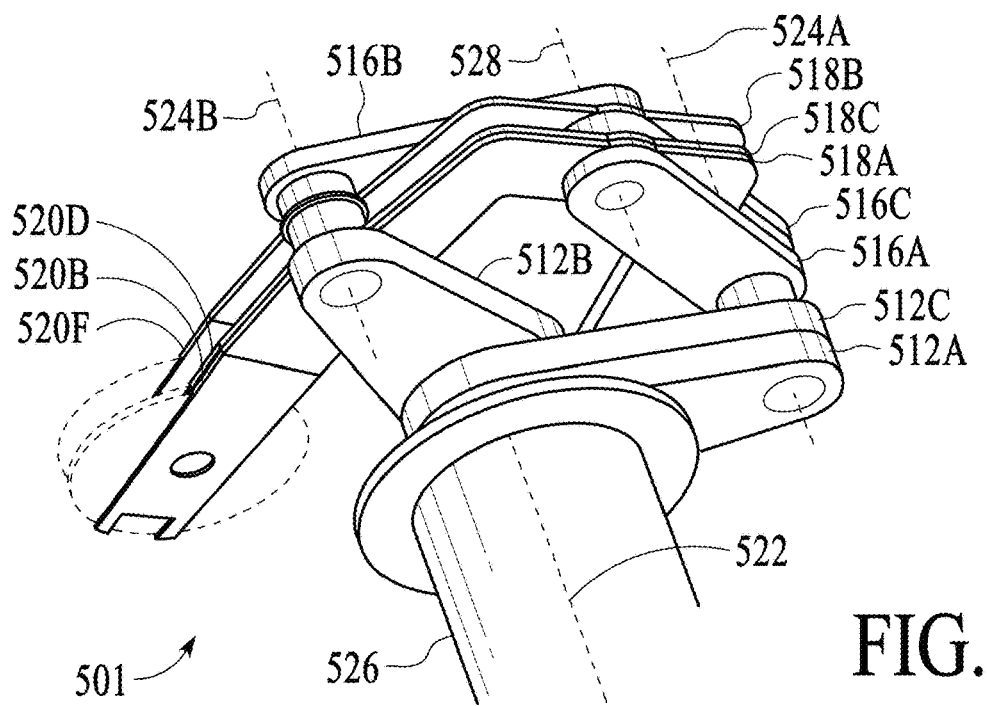
FIG. 6C illustrates a perspective view of the bottom side of a robot apparatus including two independently controllable arms, one arm having two independently controllable forearms and one arm having one independently controllable forearm, each forearm having a twin wrist member according to one or more embodiments.

FIGS. 6A-6C illustrate a robot 501 having the same configuration as robot 500, but with an additional arm 512C, forearm 516C, wrist member 518C and attached end effectors 520E, 520F. As shown, the wrist members each approximately have a U shape, and comprises a first wrist shaft positioned at a bottom center of the U shape, a first end effector positioned at a first distal end of the U shape and a second end effector positioned at a second distal end of the U shape. The wrist members may be rigid bodies, and the relative positions of the first end effector and second end effector may be fixed for each twin wrist member. Robot 501 may correspond to robot 102 in FIG. 1 and may be suitable for use with multi-substrate process chambers 103, for example, having four substrate supports. As shown in the illustrated embodiment of FIGS. 6A-6C, the third arm 512C is positioned directly above the first arm 512A, each arm 512A, 512C having its own transmission assembly to control independent rotation of the arms about a common shaft at axis 522. In embodiments, the first and third arms 512A, 512C together are double the thickness of the second arm 512B. Third forearm 516C is positioned above the first forearm 516A and is rotatable about axis 524A via a common shaft with forearm 516A. Third wrist member 518C is positioned below forearm 516C and between forearms 516A and 516C.

As shown in FIG. 6B, the spacing (e.g., 30 mm or 100 mm pitch) between the second and third wrist members 518B, 518C is greater than the spacing (e.g., 15 mm or 50 mm pitch) between the first and third wrist members 518A, 518C. Likewise, the spacing between the first and third forearms 516A, 516C is greater than the spacing between the second and third forearms 516B, 516C. In embodiments, the spacing between the forearms 516A-516C and the wrist members 518A-518C may be the same.

In further embodiments, the spacing between wrist members 518B, 518C may be at an active heating pitch (e.g., 30 mm or 100 mm) and the spacing between the wrist members 518A, 518B may be at a passive cooling pitch (e.g., 15 mm or 50 mm). For example, a batch load lock apparatus may include substrate temperature control capability such as active heating, active cooling, or both. The batch load lock apparatus may include the ability to preheat substrates prior to transferring them to the process chambers 103 and may include the ability to cool the substrates after returning from the process chambers and being transferred back to the factory interface. For example, using robot 501, two unprocessed substrates may be simultaneously retrieved by two end effectors, for example, 520E, 520F, from heater pedestals at a 30 mm or 100 mm pitch. Further, two processed substrates may be placed by end effectors 520C, 520D on two cooling pedestals at a 15 mm or 50 mm pitch.

In yet further embodiments, the spacing between the second and third wrist members 518B, 518C may be at an active heating pitch (e.g., 30 mm or 100 mm) and the spacing between the first and third wrist members 518A, 518C may be at a passive cooling pitch (e.g., 15 mm or 50 mm). For example, using robot 501, two unprocessed substrates may be simultaneously retrieved by two end effectors, for example, 520C, 520D, from heater pedestals at a 30 mm or 100 mm pitch. Further, two processed substrates may be placed by end effectors 520E, 520F on two cooling pedestals at a 15 mm or 50 mm pitch.

In embodiments, the spacing between the wrist members and end effectors may be reversed. For example, the spacing between wrist members 518B, 518C may be less than the spacing between wrist members 518A and 518B. The spacing between forearms 516B and 516C according may be greater than the spacing between forearms 516A and 516B.

Figure 7A:
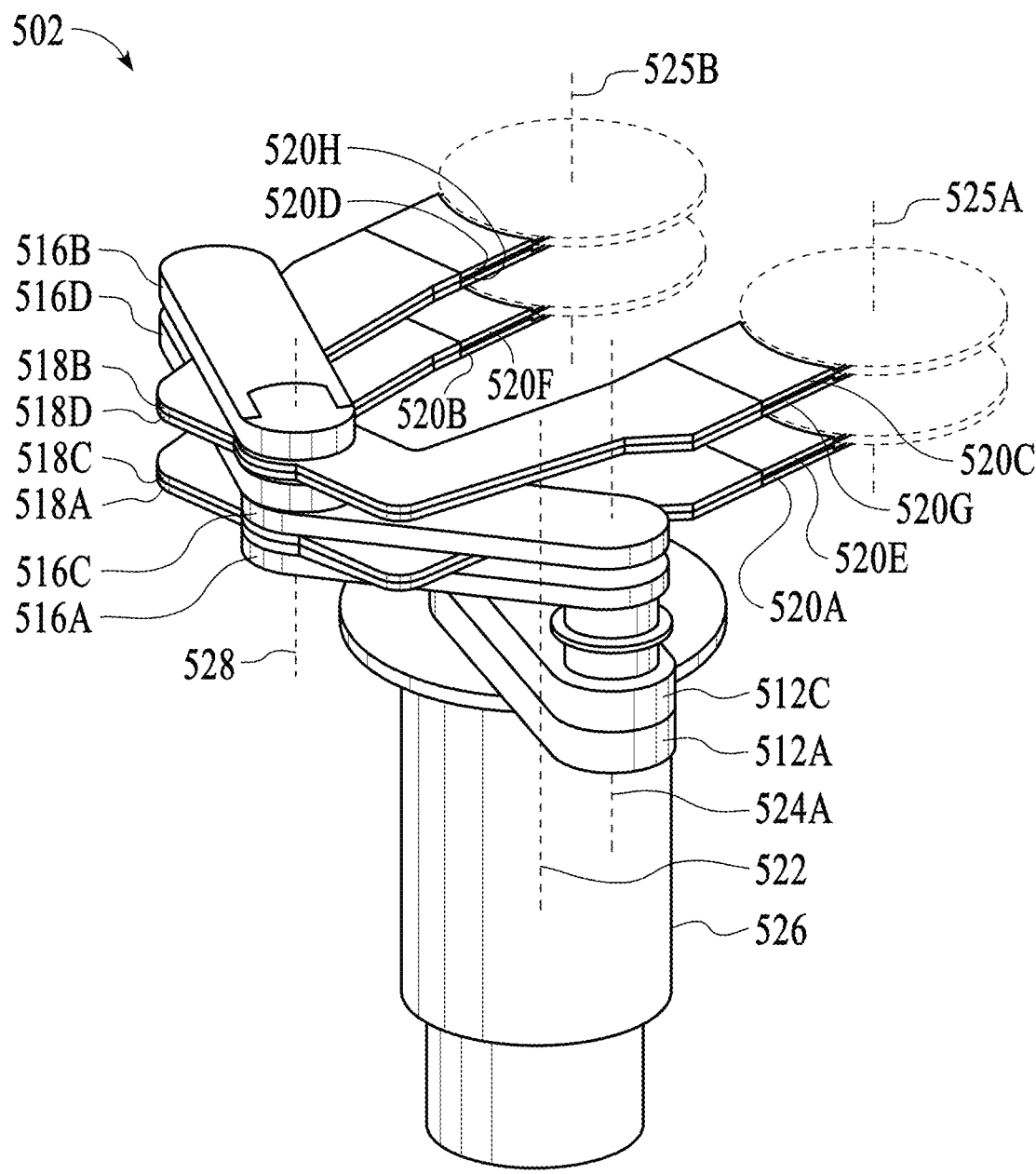
FIG. 7A illustrates a perspective view of a robot apparatus including two independently controllable arms each having two independently controllable forearms each forearm having a twin wrist member according to one or more embodiments.
Figure 7B:
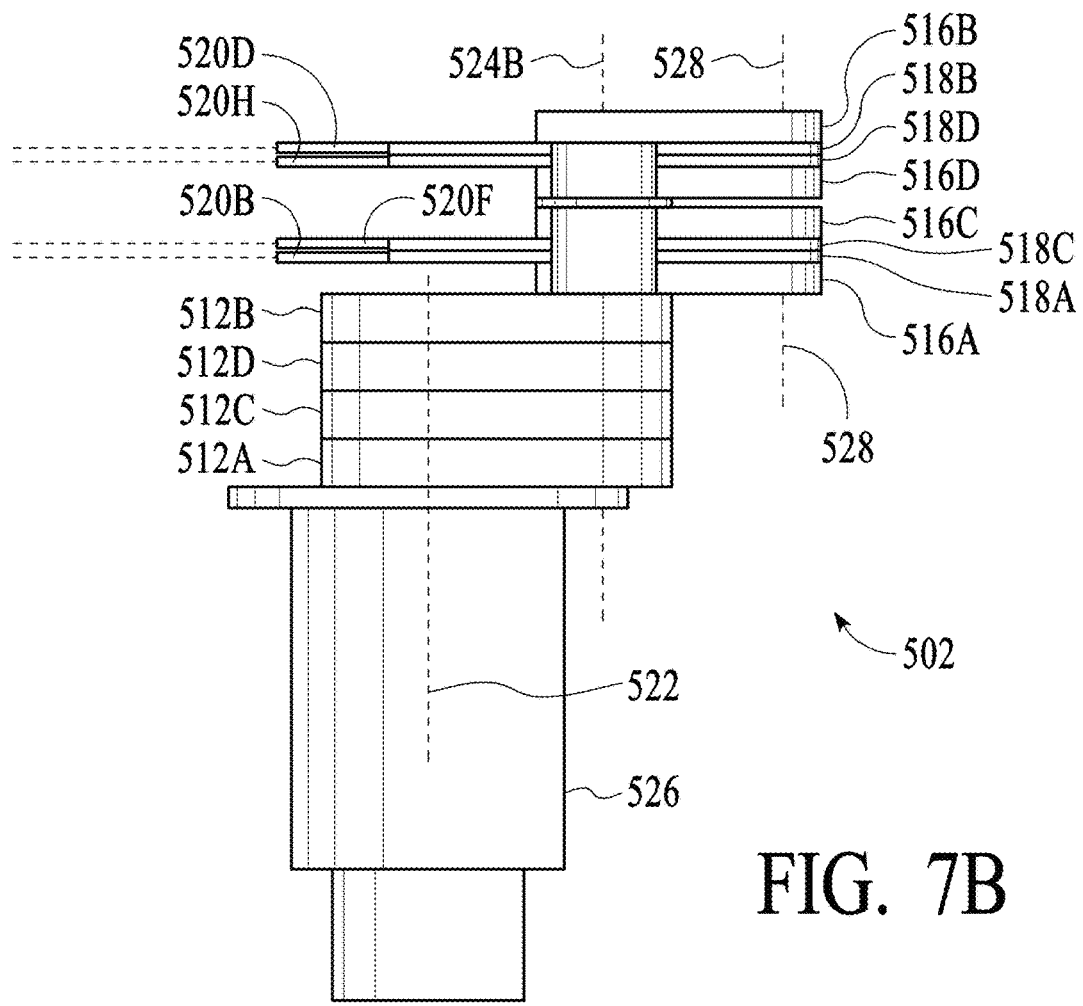
FIG. 7B illustrates a side plan view of a robot apparatus including two independently controllable arms each having two independently controllable forearms each forearm having a twin wrist member according to one or more embodiments.
Figure 7C:
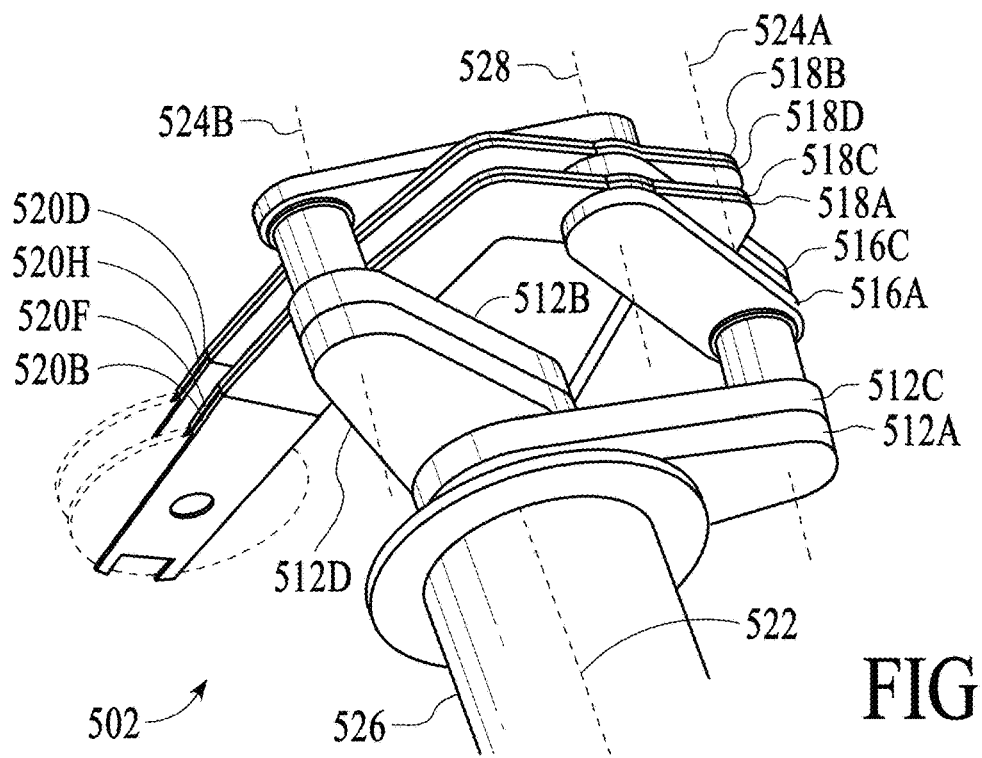
FIG. 7C illustrates a perspective view of the bottom side of a robot apparatus including two independently controllable arms each having two independently controllable forearms each forearm having a twin wrist member according to one or more embodiments.

FIGS. 7A-7C illustrate a robot 502 having the same configuration as robot 501, but with an additional forearm 516D, wrist member 518D and attached end effectors 520G, 520H. Robot 502 may correspond to robot 102 in FIG. 1 and may be suitable for use with multi-substrate process chambers 103 having four substrates as shown in FIG. 1, or having two to six substrates. As shown in the illustrated embodiment of FIGS. 7A-7C, the fourth forearm 516D is positioned below the second forearm 516B and is rotatable about axis 524B via a common shaft with the second forearm 516B. Fourth wrist member 518D is positioned above fourth forearm 516D and below second wrist member 518B. As shown in FIG. 7B, the spacing between the third and fourth wrist members 518C, 518D is greater than the spacing between the first and third wrist members 518A, 218C and the second and fourth wrist members 518B, 518D. Likewise, the spacing between the third and fourth forearms 516C, 516D is greater than the spacing between the first and third forearms 516A, 516C and the spacing between the second and fourth forearms 516B, 516D. In embodiments, the spacing between the first and third wrist members 518A, 518C is the same as the spacing between the second and fourth wrist members 518B, 518D. In embodiments, the spacing between the forearms 516A-516D and wrist members 518A-518D may be the same.

As described with respect to robot 501 in FIGS. 6A-6C, end effectors 520A, 520B, 520E, 520F may have a different pitch than end effectors 520C, 520D, 520G, 520H and may be configured to retrieve heated or cooled substrates. In embodiments, robot 502 may be configured to simultaneously retrieve four (4) unprocessed substrates from four (4) substrate supports in a load lock 109A using end effectors 520A, 520B, 520E, 520F at a first pitch. Alternatively, the robot may simultaneously retrieve two (2) substrates through the slit valve and then raise or lower in a Z direction (i.e., up or down) to retrieve two additional substrates through the slit valve. Robot 502 may then move to a process chamber to retrieve processed substrates using end effectors 520C, 520D, 520G, 520H at a second pitch and to place the four unprocessed substrates on the empty substrate supports using end effectors 520A-520D.

Robot 502 is suitable for use with multi-substrate process chambers, for example, having two (2) to six (6) substrate supports. In the use case shown in FIG. 1, the quadruple twin blade robot 502 may sequentially unload and reload substrates from and to process chambers 103 as shown having four (4) substrate supports or process chambers having six (6) substrate supports (not shown). For example, in a use case where the process chambers have six (6) substrate supports, the robot 502 carrying six (6) unprocessed substrates on six (6) of the eight (8) end effectors 520A, 520B, 520E-520H (for example), has two empty end effectors 520C, 520D (for example). The empty end effectors 520C, 520D retrieve two processed substrates from two substrate supports in a first one of the process chambers. The robot 502 then rotates the blades and places two unprocessed substrates using end effectors 520A, 520B (for example) on the empty substrate supports in the first process chamber. Using the empty end effectors 520A, 520B, the robot 502 then retrieves two additional processed substrates from two additional substrate supports and places two unprocessed substrates using end effectors 520E, 520F on the empty substrate supports. Using the empty end effectors 520E, 520F, the robot 502 then retrieves two additional processed substrates from two additional substrate supports and places two unprocessed substrates using end effectors 520G, 520H on the empty substrate supports. The robot 502 then returns to the load lock 109A to exchange the processed substrates with unprocessed substrates two at a time. Using the empty end effectors 520G, 520H (for example), the robot 502 may retrieve two unprocessed substrates from two substrate supports within the load lock 109A and place two processed substrates on the empty substrate supports. The robot 502 may continue to swap unprocessed substrates with processed substrates two at a time until six end effectors 520C-520H (for example) hold unprocessed substrates and two end effectors 520A, 520B (for example) are empty. The robot 502 may then proceed to unload/reload the process chambers.

Figure 8A:
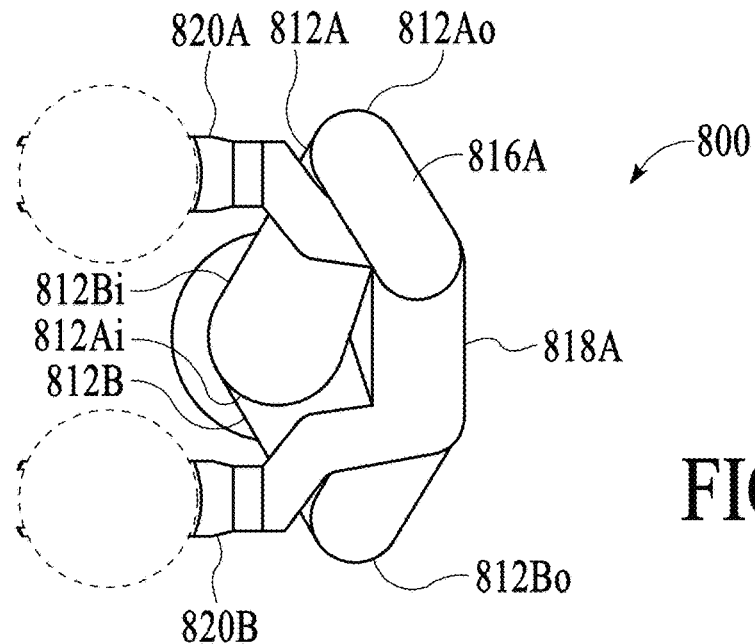
FIG. 8A illustrates an above view of a robot apparatus including two independently controllable arms each having an independently controllable forearm and each forearm having a twin wrist member according to one or more embodiments.
Figure 8B:
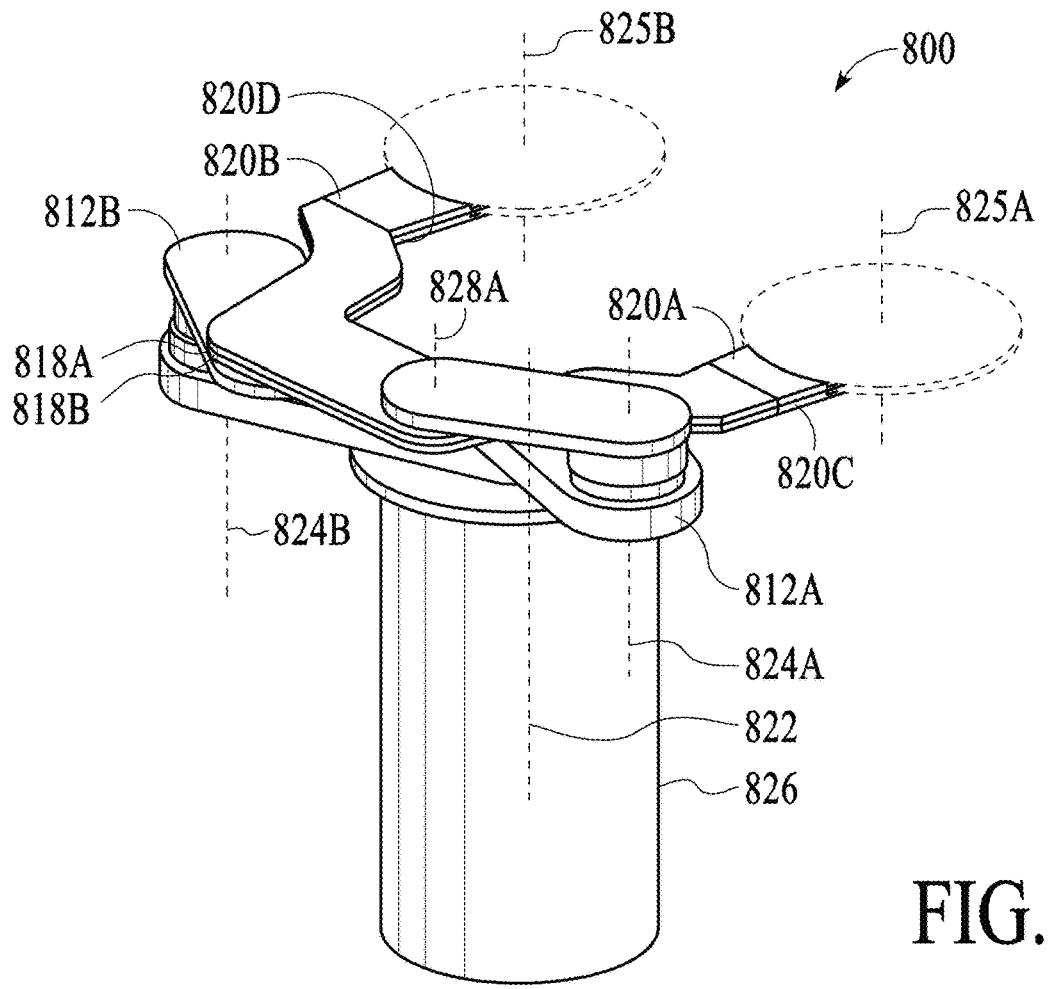
FIG. 8B illustrates a perspective view of a robot apparatus including two independently controllable arms each having an independently controllable forearm and each forearm having a twin wrist member according to one or more embodiments.
Figure 8C:
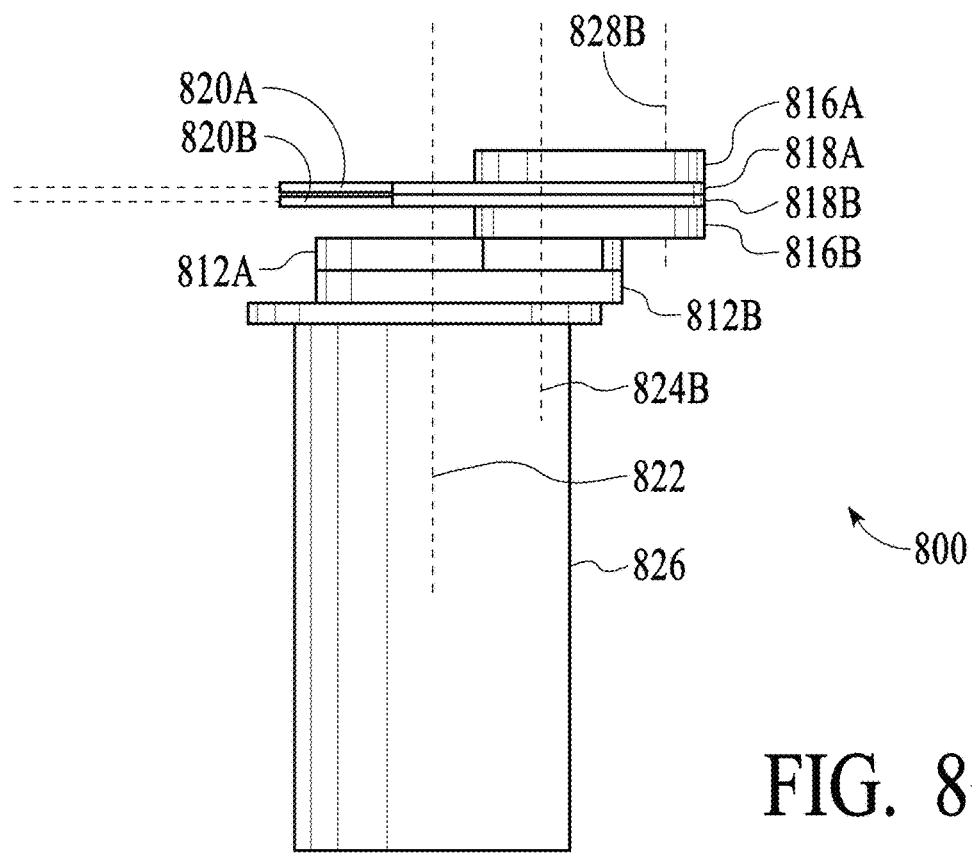
FIG. 8C illustrates a side view of a robot apparatus including two independently controllable arms each having an independently controllable forearm and each forearm having a twin wrist member according to one or more embodiments.
Figure 8D:
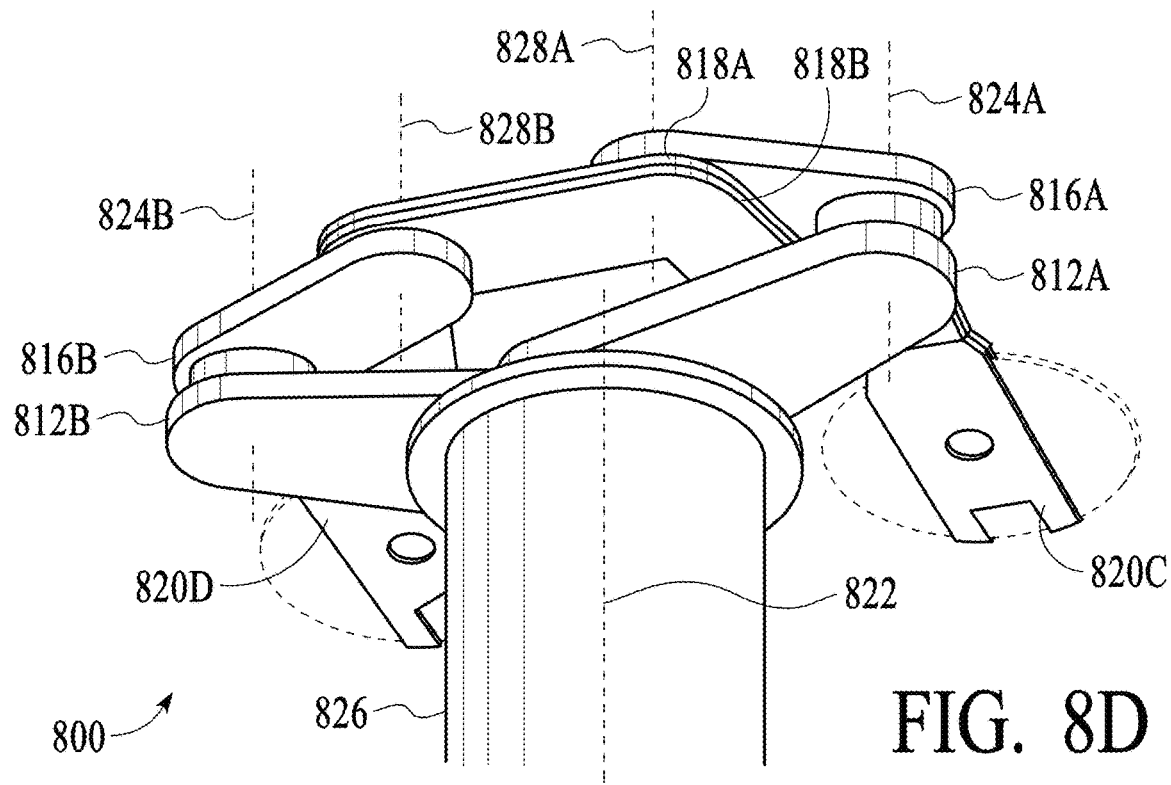
FIG. 8D illustrates a perspective view of the bottom side of a robot apparatus including two independently controllable arms each having an independently controllable forearm and each forearm having a twin wrist member according to one or more embodiments.

FIG. 8A illustrates an above view of a robot apparatus including two independently controllable arms each having an independently controllable forearm and each forearm having a twin wrist member according to one or more embodiments. As shown, the wrist members each approximately have a U shape, and comprises a first wrist shaft positioned at a bottom center of the U shape, a first end effector positioned at a first distal end of the U shape and a second end effector positioned at a second distal end of the U shape. The wrist members may be rigid bodies, and the relative positions of the first end effector and second end effector may be fixed for each twin wrist member. FIG. 8B illustrates a perspective view of a robot apparatus including two independently controllable arms each having an independently controllable forearm and each forearm having a twin wrist member according to one or more embodiments. FIG. 8C illustrates a side view of a robot apparatus including two independently controllable arms each having an independently controllable forearm and each forearm having a twin wrist member according to one or more embodiments. FIG. 8D illustrates a perspective view of the bottom side of a robot apparatus including two independently controllable arms each having an independently controllable forearm and each forearm having a twin wrist member according to one or more embodiments.

In an embodiment, robot apparatus 800 corresponds to robot apparatus 102 of FIG. 1. In such embodiments, the robot apparatus 800 may be configured and adapted to transfer substrates between various process chambers 103 and/or to exchange substrates at one or more load lock apparatus 109A, 109B. In the depicted embodiment of FIG. 1, two load lock apparatus 109A, 109B are shown. However, the robot apparatus 800 could be used with only one load lock apparatus or more than two load lock apparatus.

The robot apparatus 800 has a first arm 812A and a second arm 812B each including an inboard end 812Ai, 812Bi and an outboard end 812Ao, 812Bo, respectively. The inboard ends 812Ai, 812Bi are configured to be rotatable about a shoulder axis 822 by an arm drive motor of a drive motor assembly 826. Drive assemblies of driving and driven pulleys (e.g., circular and non-circular) and transmission members are included within arms 812A, 812B. Each arm 812A, 812B can have a center-to-center length of L1, wherein the centers of the length L1 are the shoulder axis 822 and outboard axes 824B, 824B.

Robot apparatus 800 as shown includes two forearms 816A, 816B coupled to the outboard ends 812Ao, 812Bo of arms 812A, 812B opposite from inboard ends 812Ai, 812Bi. Each forearm 816A, 816B has a center-to-center length L2 wherein the centers of the length L2 are the outboard axes 824A, 824B (a.k.a. the elbow joints of the forearms) and axes 828A, 828B (a.k.a. wrist joints), respectively. Each forearm 816A, 816B is independently rotatable about a shaft at the respective outboard axes 824A, 824B through the commanded action of a first forearm drive motor, and a second forearm drive motor, respectively. The first forearm drive motor and second forearm drive motor are commanded by a suitable control signal received from a controller (not shown). The controller can be any suitable processor, memory, electronics and/or drivers capable of processing control instructions and carrying out motion of forearm 816A, 816B.

Coupled to each forearm 816A, 816B is an independently rotatable twin wrist member 818A, 818B, respectively, each having two legs attached to which is an end effector 820A-820D. As shown in the illustrated embodiments of FIGS. 8A-8D, each wrist member 818A, 818B has two end effectors 820A, 820B and 820C, 820D, respectively, in a butterfly configuration. Each wrist member 818A, 818B is independently rotatable about axes 828A, 828B through the commanded action of a first wrist drive motor and a second wrist drive motor, respectively. As shown, each forearm 816A, 816B is asymmetrically coupled to each wrist member 818A, 818B at the respective rotational axis 828A, 828B. The first wrist drive motor and second wrist drive motor are commanded by a suitable control signal received from a controller (not shown). The controller can be any suitable processor, memory, electronics and/or drivers capable of processing control instructions and carrying out motion of the wrist member 818A, 818B. The wrist members 818A, 818B are configured to rotate about a nominal center at axes 828A, 828B located halfway between each leg.

The nominal centers 825A, 825B of end effectors 820A-820D are where substrates will rest on each end effector when nominally positioned thereon, as depicted. Restraining features restrain the location of the substrates on the end effectors 820A-820D within limits. In the depicted embodiment, the wrist members 818A, 818B and the end effectors 820A-820D are separate interconnected members. However, it should be understood that each forearm member and end effector may be integrally formed in some embodiments and constitute one unitary component. In the depicted embodiment, each of the forearm members 816A, 816B may include a corresponding orientation adjuster at the end thereof to allow for fine orientation adjustments (e.g., adjustments for droop and/or tilt) to each of the end effectors 820A-820D. The orientation adjusters can use screws and/or shims to accomplish end effector attitude adjustments.

It should be apparent that the first forearm 816A is configured for independent rotation relative to arm 812A about a shaft at outboard axis 824A. The first forearm 816A is coupled to first wrist member 818A at a position offset from the nominal center of wrist member 818A corresponding to axis 828A about which the wrist member 818A rotates. Wrist member 818A has two legs, each of which is coupled to a first end effector 820A and a second end effector 820B. First arm 812A may be positioned above second arm 812B. First forearm member 816A may be positioned above first arm 812A. Second forearm 816B may be configured for independent rotation relative to the arm 812B about the outboard axis 824B. Second forearm 816B is coupled to a second wrist member 818B at a position offset from the nominal center of wrist member 818B corresponding to axis 828B about which the wrist member 818B rotates. Wrist member 818B has two legs, each of which is coupled to a third end effector 820C and a fourth end effector 820D. Second forearm member 816B may be positioned above second arm 812B and below first forearm 816A. First wrist member 818A and the first and second end effectors 820A, 820B are positioned above second wrist member 818B and the third and fourth end effectors 820C, 820D.

As can be seen in FIGS. 8A-8D, the first and second end effectors 820A, 820B lie directly above the third and fourth end effectors 820C, 820D, respectively, when configured in a folded and zeroed configuration (e.g., in a vertically stacked configuration), as shown. Forearms 816A, 816B are at an acute angle with respect to arms 812A, 812B about axes 824A, 824B when in a zeroed, folded configuration. This zeroed and folded configuration is the neutral configuration and the forearms 816A, 816B can be rotated approximately +/−170 degrees from this orientation, for example. As further shown in FIGS. 8A-8D, in embodiments, the first wrist member 818A is positioned below the first forearm 816A and above the second wrist member 818B. The second wrist member 818B is positioned above the second forearm 816B.

In the use case shown in FIG. 1, robot 800 may sequentially unload and reload substrates from and to process chamber 103 or a process chamber containing two (2) substrates. For example, the robot 800 carrying two (2) unprocessed substrates on two of the four end effectors 820A, 820B (for example), has two empty end effectors 820C, 820D (for example). The empty end effectors 820C, 820D retrieve two processed substrates from two substrate supports 110 in a first one of the process chambers. The robot 800 then places two unprocessed substrates using end effectors 820A, 820B (for example) on the empty substrate supports in the first process chamber. Robot 800 may then return to load lock 109A to exchange the processed substrates with unprocessed substrates two at a time. Using the empty end effectors 820A, 820B (for example), the robot 800 may retrieve two unprocessed substrates from two substrate supports within the load lock 109A and place the two processed substrates on the empty substrate supports using end effectors 820C, 820D. Robot 800 may then proceed to unload/reload the process chambers.

Figure 9A:
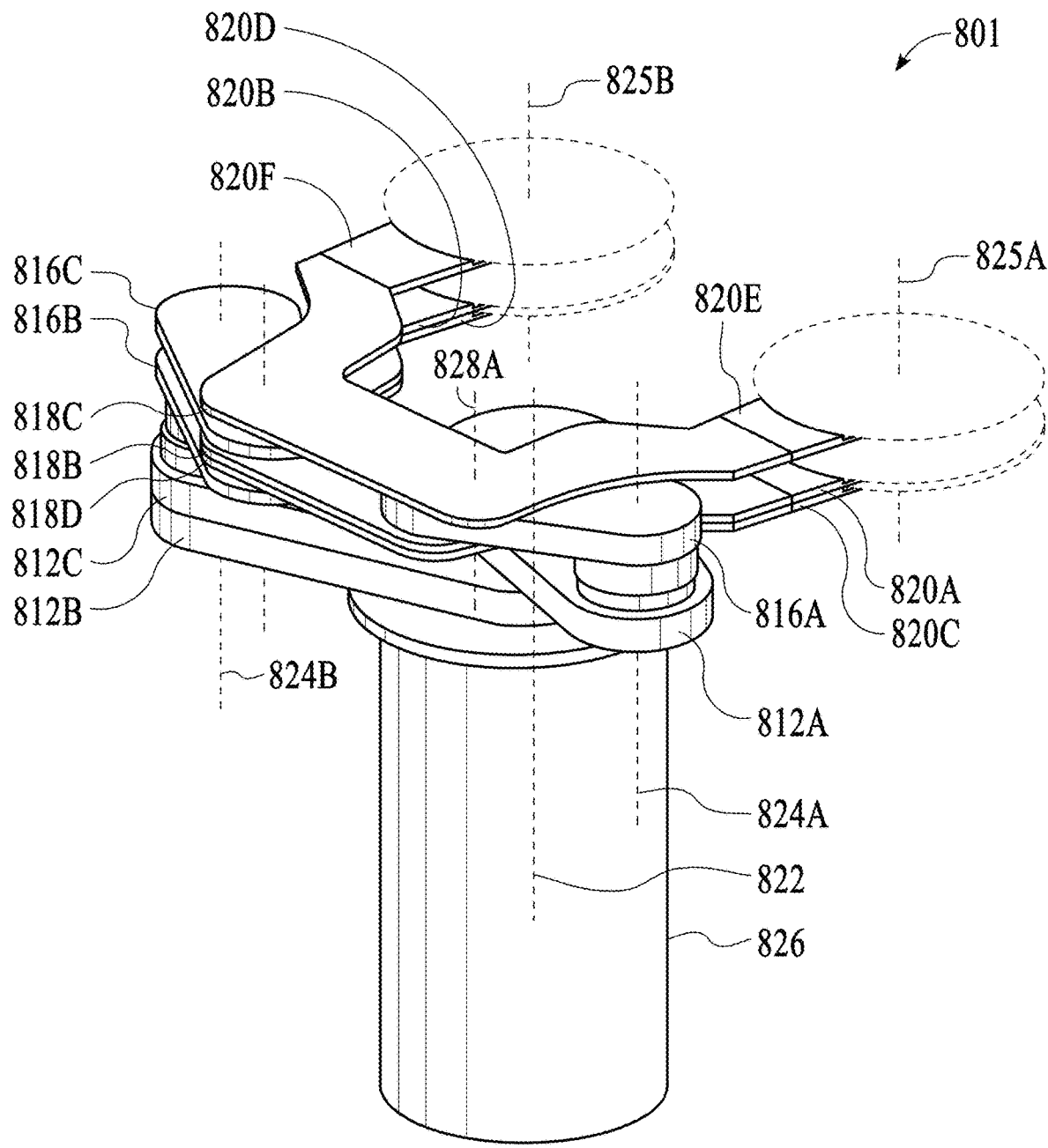
FIG. 9A illustrates a perspective view of a robot apparatus including two independently controllable arms, one arm having two independently controllable forearms and one arm having one independently controllable forearm, each forearm having a twin wrist member according to one or more embodiments.
Figure 9B:
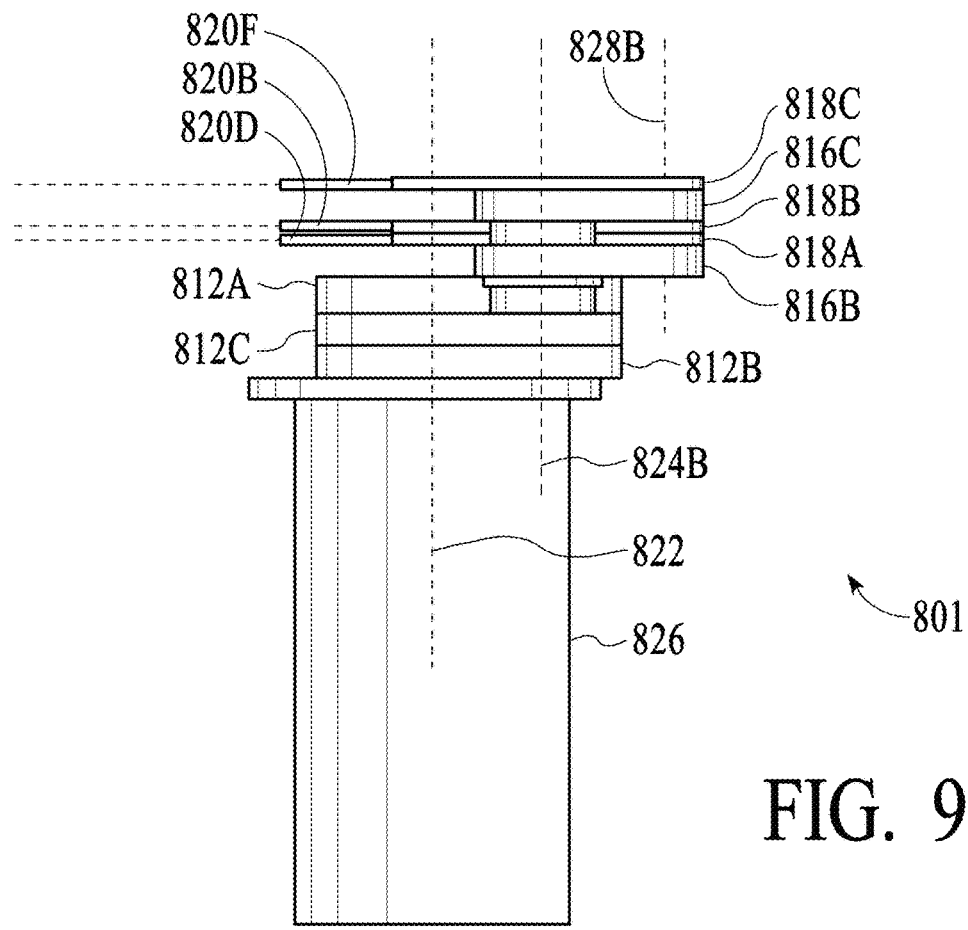
FIG. 9B illustrates a side plan view of a robot apparatus including two independently controllable arms, one arm having two independently controllable forearms and one arm having one independently controllable forearm, each forearm having a twin wrist member according to one or more embodiments.
Figure 9C:
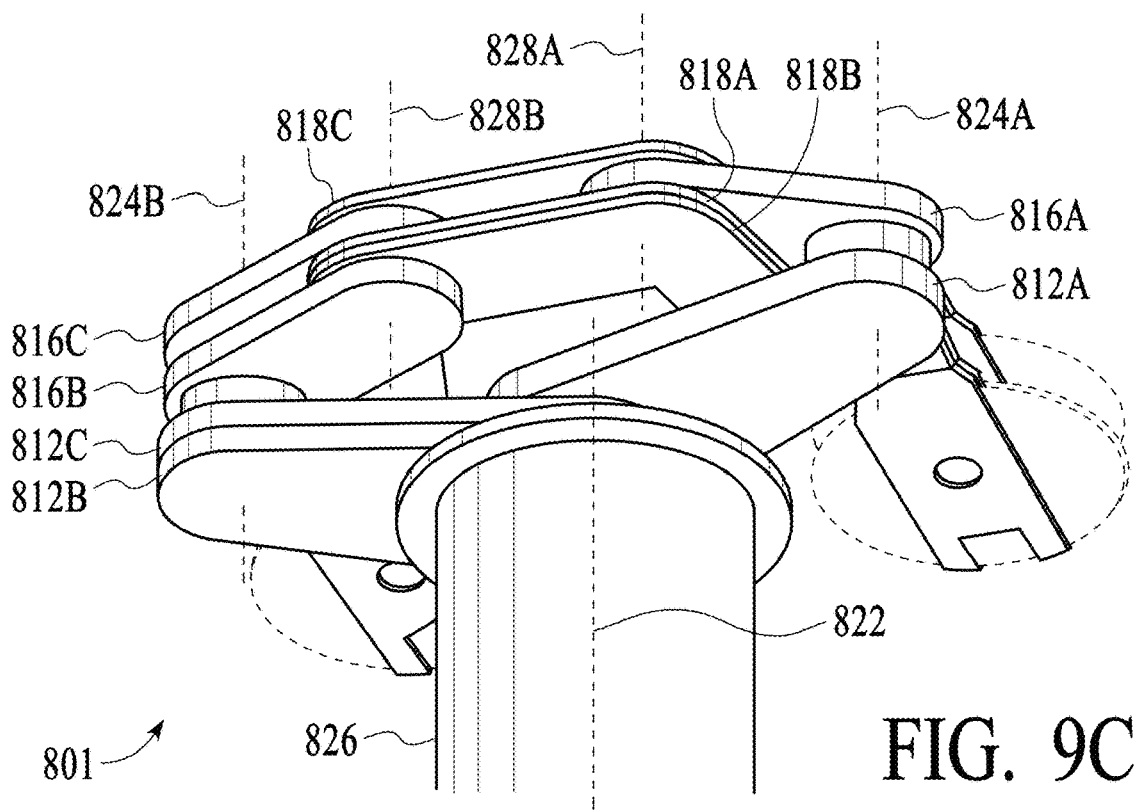
FIG. 9C illustrates a perspective view of the bottom side of a robot apparatus including two independently controllable arms, one arm having two independently controllable forearms and one arm having one independently controllable forearm, each forearm having a twin wrist member according to one or more embodiments.

FIGS. 9A-9C illustrate a robot 801 having the same configuration as robot 800, but with an additional arm 812C, forearm 816C, wrist member 818C and attached end effectors 820E, 820F. Robot 801 may correspond to robot 102 in FIG. 1 and may be suitable for use with multi-substrate process chambers 103, for example, having four substrate supports. As shown in the illustrated embodiment of FIGS. 9A-9C, the arm 812C is positioned directly above arm 812B, each arm 812B, 812C having its own transmission assembly to control independent rotation of the arms about a common shaft at axis 822. In embodiments, the arms 812B, 812C together are double the thickness of arm 812B. Forearm 816C is positioned above forearm 816B and is in the same plane or height as forearm 816A. This configuration may be more compact than a configuration where the forearms are in different planes. Forearm 816C is rotatable about axis 824B via a common shaft with forearm 816B. Wrist member 818C is positioned above forearm 816C. As shown in FIG. 9B, the spacing (e.g., 30 mm or 65 mm pitch) between wrist members 818B, 818C is greater than the spacing (e.g., 15 mm or 32.5 mm pitch) between the wrist members 818A, 818C. Likewise, the spacing between forearms 816A, 816C is greater than the spacing between the forearms 816B, 816C. In embodiments, the spacing between the forearms 816A-816C and the wrist members 818A-818C may be the same.

In further embodiments, the spacing between the wrist members 818B, 818C may be at an active heating pitch (e.g., 30 mm or 65 mm) and the spacing between the first and second wrist members 818A, 818B may be at a passive cooling pitch (e.g., 15 mm or 32.5 mm). For example, a batch load lock apparatus may include substrate temperature control capability such as active heating, active cooling, or both. The batch load lock apparatus may include the ability to preheat substrates prior to transferring them to the process chambers 103 and may include the ability to cool the substrates after returning from the process chambers and being transferred back to the factory interface. For example, using robot 801, two unprocessed substrates may be simultaneously retrieved by two end effectors, for example, 820E, 820F, from heater pedestals at a 30 mm or 65 mm pitch. Further, two processed substrates may be placed by end effectors 820C, 820D on two cooling pedestals at a 15 mm or 32.5 mm pitch.

In further embodiments, the spacing between wrist members 818B, 818C is at an active heating pitch (e.g., 30 mm or 65 mm) and the spacing between wrist members 818A, 818C is at a passive cooling pitch (e.g., 15 mm or 32.5 mm). For example, using robot 801, two unprocessed substrates may be simultaneously retrieved by two end effectors, for example, 820E, 820F, from heater pedestals at a 30 mm or 65 mm pitch. Further, two processed substrates may be placed by end effectors 820C, 820D on two cooling pedestals at a 15 mm or 32.5 mm pitch.

Figure 10A:
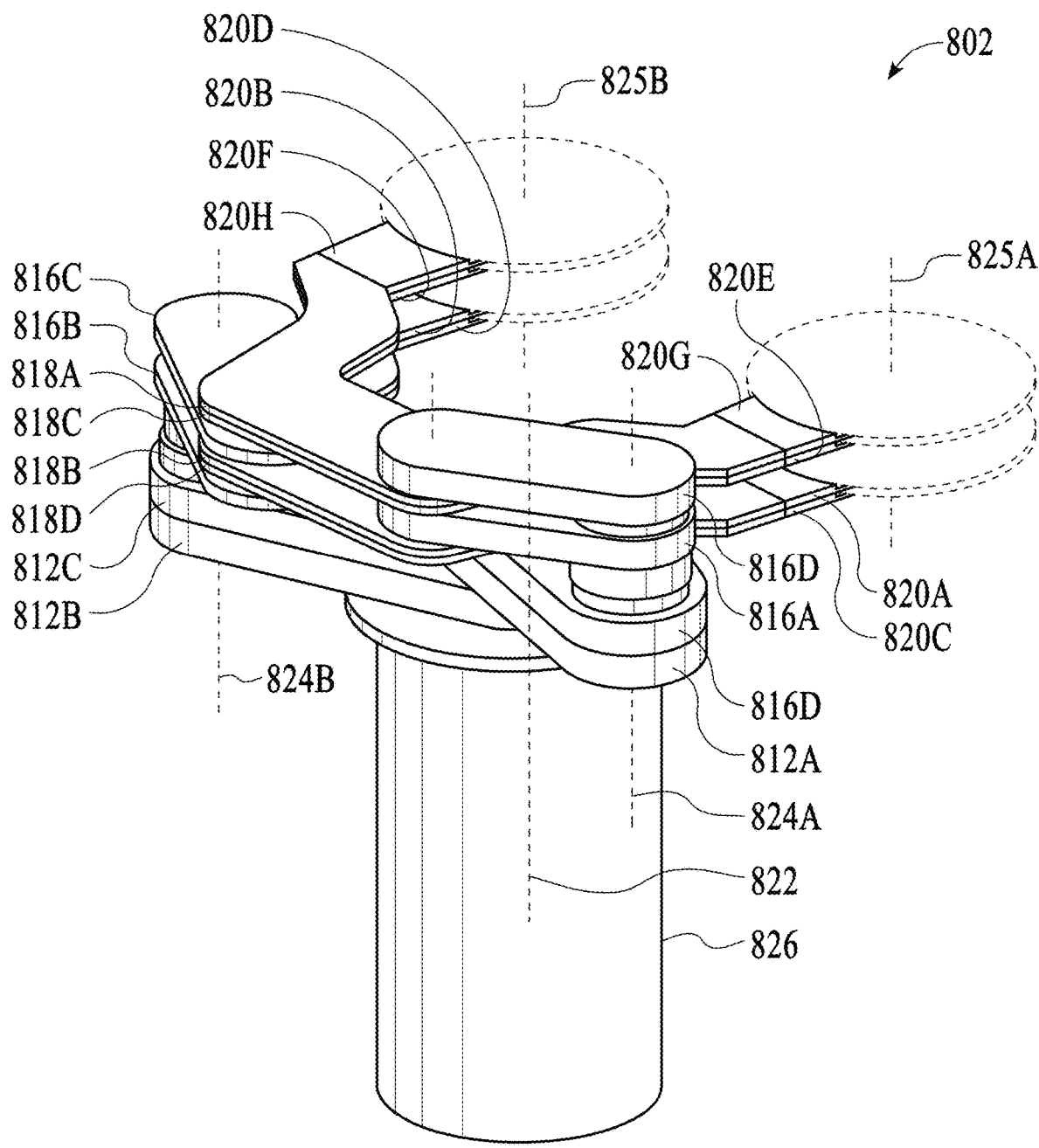
FIG. 10A illustrates a perspective view of a robot apparatus including two independently controllable arms each having two independently controllable forearms each forearm having a twin wrist member according to one or more embodiments.
Figure 10B:
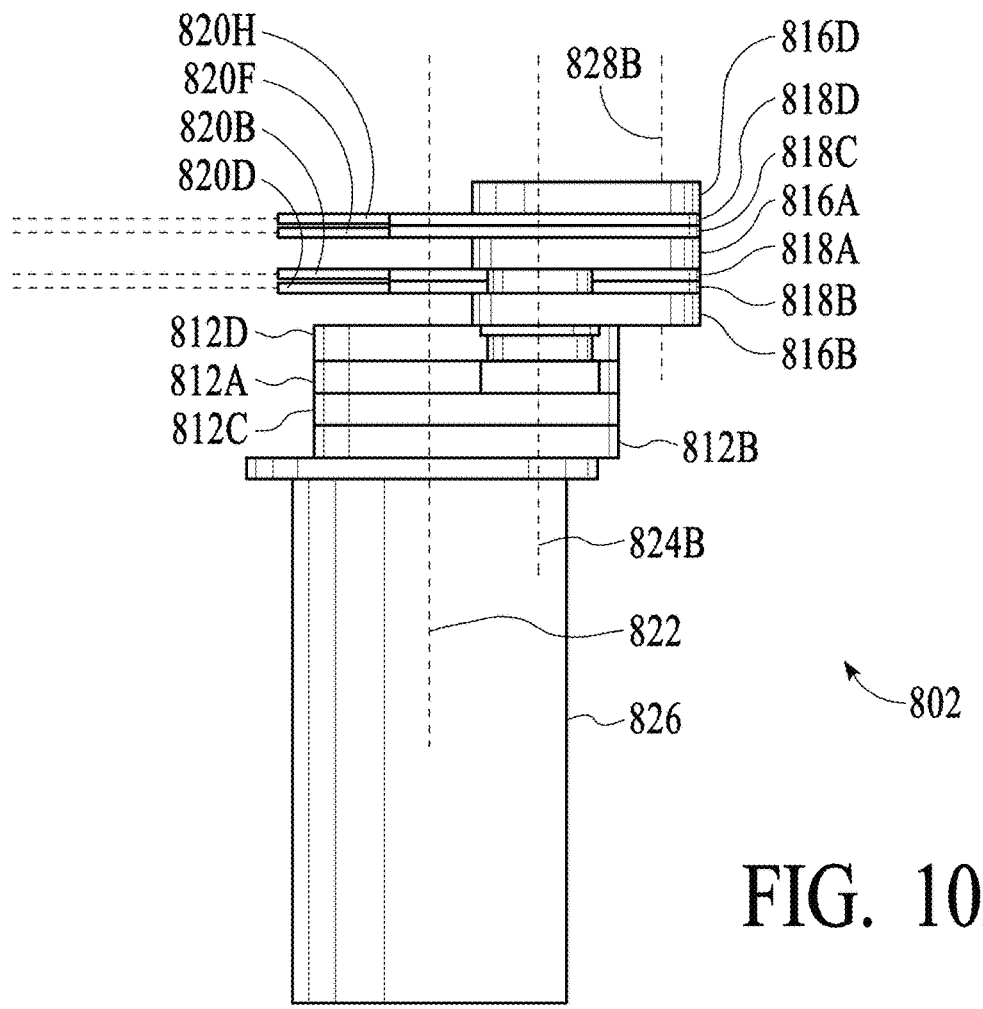
FIG. 10B illustrates a side plan view of a robot apparatus including two independently controllable arms each having two independently controllable forearms each forearm having a twin wrist member according to one or more embodiments.
Figure 10C:
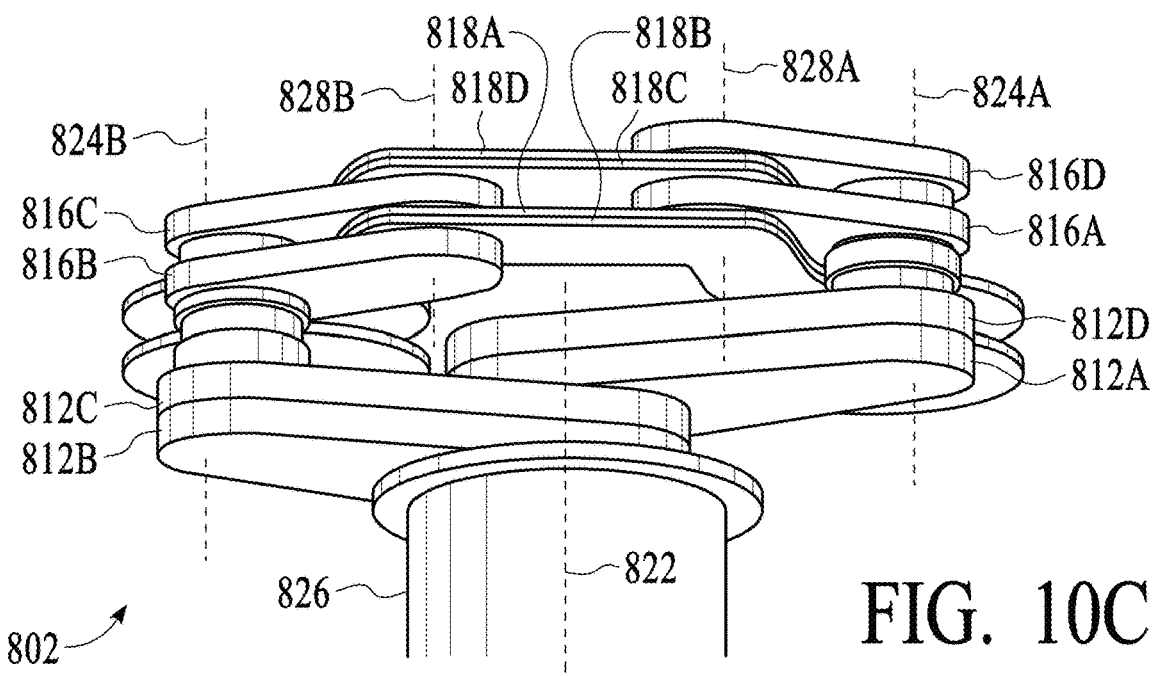
FIG. 10C illustrates a perspective view of the bottom side of a robot apparatus including two independently controllable arms each having two independently controllable forearms each forearm having a twin wrist member according to one or more embodiments.

FIGS. 10A-10C illustrate a robot 802 having the same configuration as robot 801, but with an additional forearm 816D, wrist member 818D and attached end effectors 820G, 820H. Robot 802 may correspond to robot 102 in FIG. 1 and may be suitable for use with multi-substrate process chambers 103 having four substrates as shown in FIG. 1, or having two to six substrates. As shown in the illustrated embodiment of FIGS. 10A-10C, forearm 816D is positioned above forearm 816A and is rotatable about axis 824A via a common shaft with forearm 816A. Wrist member 818D is positioned below forearm 816D and above wrist member 818C. As shown in FIG. 10B, the spacing between wrist members 818C, 818A is greater than the spacing between wrist members 818C, 818D and wrist members 818A, 818B. Likewise, the spacing between forearms 816A, 816D is the same as the spacing between forearms 816B, 816C. Forearms 816A and 816C are in the same plane, with forearm 816D above the plane and forearm 816B below the plane.

As described with respect to robot 801 in FIGS. 9A-9C, end effectors 820A-820D may have a different pitch than end effectors 820E-820G and may be configured to retrieve heated or cooled substrates. In embodiments, robot 802 may be configured to simultaneously retrieve four (4) unprocessed substrates from four (4) substrate supports in a load lock 109A using end effectors 820A-820D at a first pitch. Alternatively, the robot may simultaneously retrieve two (2) substrates through the slit valve and then raise or lower in a Z direction (i.e., up or down) to retrieve two additional substrates through the slit valve. Robot 802 may then move to a process chamber to retrieve processed substrates using end effectors 820E-820G at a second pitch and to place the four unprocessed substrates on the empty substrate supports using end effectors 820A-820D.

Robot 802 is suitable for use with multi-substrate process chambers, for example, having two (2) to six (6) substrate supports. In the use case shown in FIG. 1, the quadruple twin blade robot 802 may sequentially unload and reload substrates from and to process chambers 103 as shown having four (4) substrate supports or process chambers having six (6) substrate supports (not shown). For example, in a use case where the process chambers have six (6) substrate supports, the robot 802 carrying six (6) unprocessed substrates on six (6) of the eight (8) end effectors 820A-820F (for example), has two empty end effectors 820G, 820H (for example). The empty end effectors 820G, 820H retrieve two processed substrates from two substrate supports in a first one of the process chambers. The robot 802 then rotates the blades and places two unprocessed substrates using end effectors 820A, 820B (for example) on the empty substrate supports in the first process chamber. Using the empty end effectors 820A, 820B, the robot 802 then retrieves two additional processed substrates from two additional substrate supports and places two unprocessed substrates using end effectors 820C, 820D on the empty substrate supports. Using the empty end effectors 820C, 820D, the robot 802 then retrieves two additional processed substrates from two additional substrate supports and places two unprocessed substrates using end effectors 820E, 820F on the empty substrate supports. The robot 802 then returns to the load lock 109A to exchange the processed substrates with unprocessed substrates two at a time. Using the empty end effectors 820E, 820F (for example), the robot 802 may retrieve two unprocessed substrates from two substrate supports within the load lock 109A and place two processed substrates on the empty substrate supports. The robot 802 may continue to swap unprocessed substrates with processed substrates two at a time until six end effectors 820A, 820B, 820E-820H (for example) hold unprocessed substrates and two end effectors 820C, 820D (for example) are empty. The robot 802 may then proceed to unload/reload the process chambers.

Figure 11:
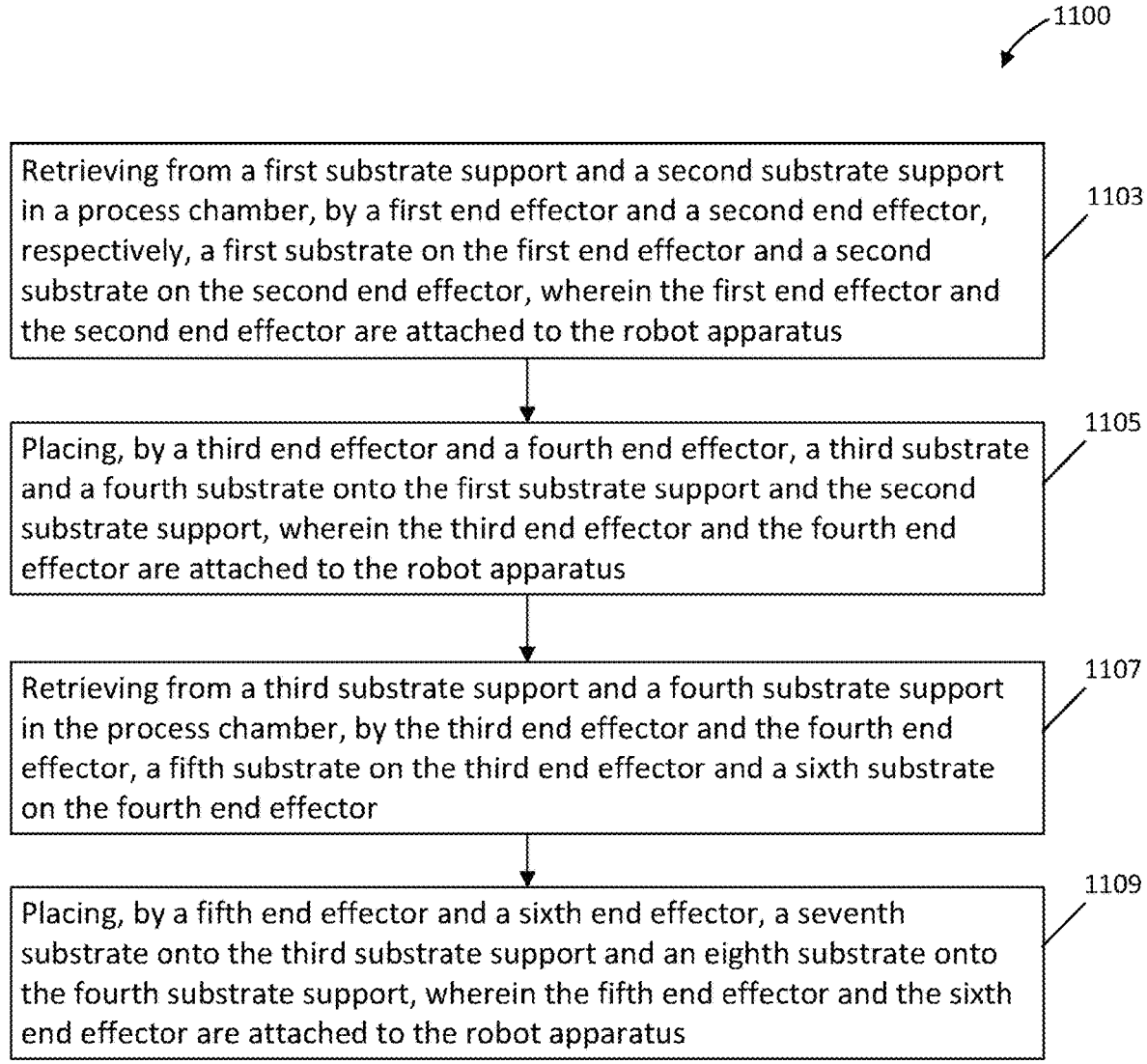
FIG. 11 is a flowchart illustrating a method of transporting substrates to and from processing chambers, according to one or more embodiments.
Figure 12:
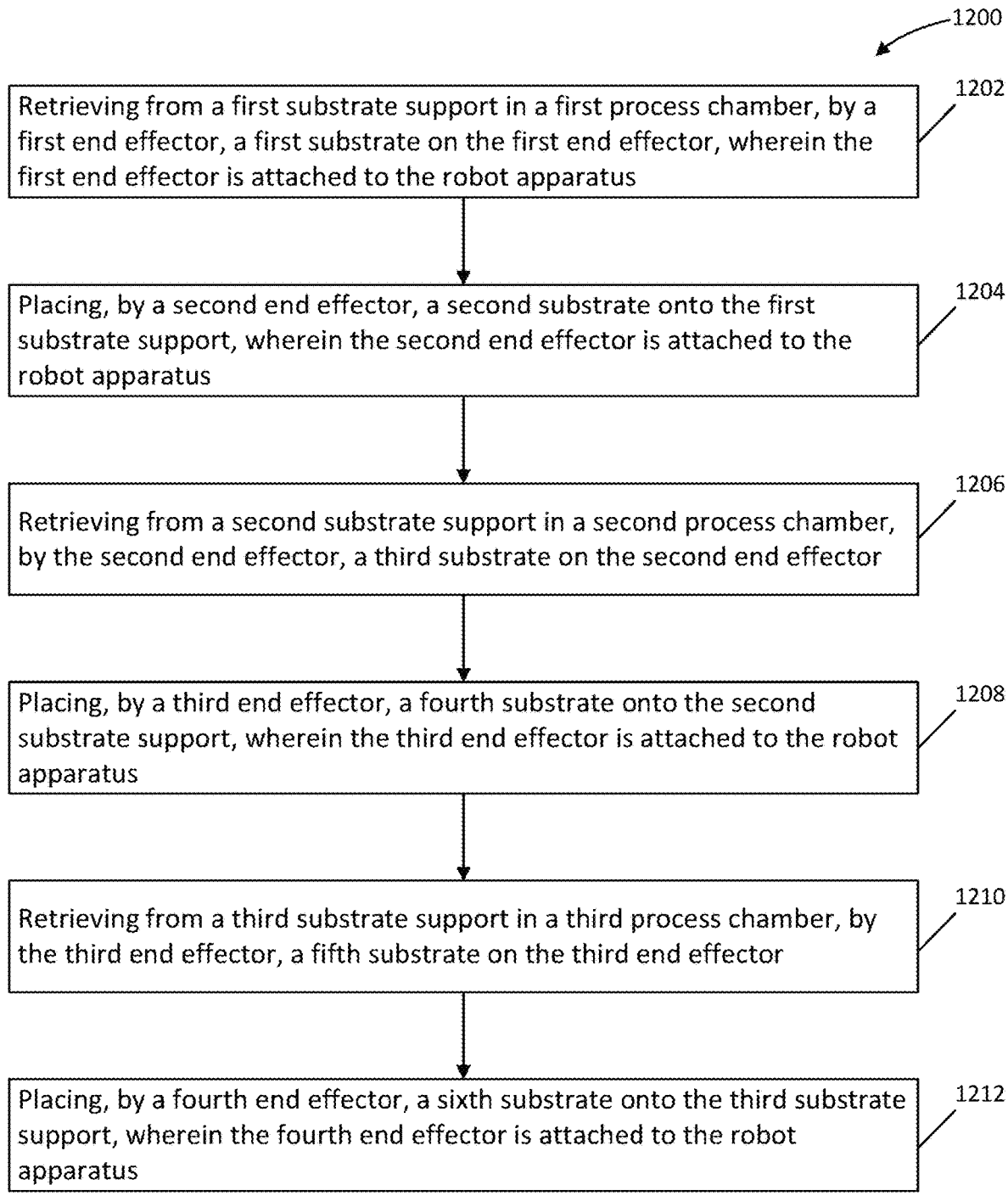
FIG. 12 is a flowchart illustrating a method of transporting substrates to and from processing chambers, according to one or more embodiments.

Referring now to FIG. 11, a method 1100 of transporting substrates to and from at least one process chamber an even number of substrate supports (e.g., at least 2), for example, as in FIG. 1, is described. Method 1100 may be performed using any of the robot apparatuses described herein. In embodiments, the robot apparatus includes at four (4) end effectors. Each end effector may be attached to a distal end of a corresponding twin wrist member of a robot apparatus. In embodiments, the robot apparatus has four wrist members, each having two blades attached thereto.

The method 1100 includes, at block 1103, retrieving (e.g., simultaneously or in parallel) from a first substrate support and a second substrate support, by a first end effector and a second end effector, respectively, a first substrate on the first end effector and a second substrate on the second end effector, wherein the first end effector and the second end effector are attached to the robot apparatus. The method 1100 includes, at block 1105, placing (e.g., simultaneously or in parallel), by a third end effector and a fourth end effector, a third substrate and a fourth substrate onto the first substrate support and the second substrate support (respectively), wherein the third end effector and the fourth end effector are attached to the robot apparatus.

The method 1100 includes, at block 1107, retrieving from a third substrate support and a fourth substrate support in the process chamber, by the third end effector and the fourth end effector (respectively), a fifth substrate on the third end effector and a sixth substrate on the fourth end effector. The method 1100 includes, at block 1109, placing, by a fifth end effector and a sixth end effector, a seventh substrate onto the third substrate support and an eighth substrate onto the fourth substrate support, wherein the fifth end effector and the sixth end effector are attached to the robot apparatus.

As a result of the retrieving and the placing, the third, fourth, seventh and eighth substrates are placed in the process chamber, the first, second, third and fourth end effectors each hold one of the four processed substrates, and the fifth and sixth end effectors are empty. After the processed substrates have been removed from the process chamber and are held on the end effectors, they may be placed into a load lock or other process chamber. In one embodiment, the first and second end effectors simultaneously or in parallel place the processed substrates in a load lock and may retrieve unprocessed substrates from a load lock, and the fifth and sixth end effectors simultaneously or in parallel place the processed substrates in the load lock and may retrieve unprocessed substrates from a load lock. Method 1100 is discussed for a manufacturing system including a plurality of substrate supports to be handled as a unit, and with a robot arm having a plurality of end effectors (e.g., an even number of end effectors). However, in embodiments method 1100 may also be performed to handle process chambers having six (6) substrates supports, where there are eight (8) end effectors (e.g., from a quadruple twin robot apparatus). In such an embodiment, additional operations would be performed after block 1109 to pick up a ninth and tenth processed substrate, and then to place an eleventh and twelfth unprocessed substrate.

Systems, robot apparatuses and methods disclosed herein can increase throughput and efficiency over electronic device manufacturing systems, robots and methods known in the art. For example, a known put and get sequence that is carried out by a known robot apparatus to unload a set of four processed wafers from a quad process chamber and to load the quad process chamber with four unprocessed wafers is as follows:

Dual GET from a load lock by first and second end effectors (2 substrates picked up) (6.8 sec)
Rotate to Chamber (5 sec)
Dual GET from process chamber by third and fourth end effectors (7.2 sec)
Dual PUT to process chamber by the first and second end effectors (2 substrates placed on two substrate holders) (7.2 sec)
Chamber spindle rotates 180 degrees (0 sec)
Rotate to load lock (5 sec)
Dual PUT to load lock by third and fourth end effectors (6.8 sec)
Dual GET from load lock by first and second end effectors (6.8 sec)
Rotate to Chamber (5.0 sec)
Dual GET from process chamber by third and fourth end effectors (7.2 sec)
Dual PUT to process chamber by first and second end effectors (7.2 sec)
Rotate to load lock (5 sec)
Dual PUT to load lock by third and fourth end effectors (6.8 sec)
Total time: 76 sec=>189.47 substrates per hour In comparison, a suitable put and get sequence that is carried out by a triple twin yaw robot apparatus as shown in FIGS. 3A-3C, 6A-6C and 9A-9C to unload a set of four processed wafers from a quad process chamber and to load the quad process chamber with four unprocessed wafers is as follows:

Dual GET from a load lock by first and second end effectors (2 substrates picked up) (6.8 sec)
Dual GET from the load lock by third and fourth end effectors (2 substrates picked up) (6.8 sec)
Rotate to Chamber (5 sec)
Dual GET from process chamber with fifth and sixth end effectors (7.2 sec)
Dual PUT to process chamber with third and fourth end effectors (7.2 sec)
Dual GET from process chamber with third and fourth end effectors (7.2 sec)
Dual PUT to process chamber with first and second end effectors (7.2 sec)
Rotate to load lock (5 sec)
Dual PUT to process chamber with fifth and sixth end effectors (6.8 sec)
Dual PUT to process chamber with third and fourth end effectors (6.8 sec)
Total time: 56 sec=>257.14 substrates per hour.

As shown in this example, providing a robot apparatus having at least an even number of end effectors according to embodiments herein can eliminate sequence steps requiring a return to the load lock. Enabling the robot apparatus to completely swap processed substrates with unprocessed substrates in a single cycle can significantly improve efficiency and substrate throughput of electronic device processing systems.

The foregoing description discloses only certain example embodiments. For example, certain example embodiments describe two stacked end effectors. Modifications of the above-disclosed systems, apparatus, and methods which fall within the scope of the disclosure will be readily apparent to those of ordinary skill in the art. For example, embodiments discussed with reference to two stacked end effectors also apply to three, four or more stacked end effectors. Additionally, embodiments are not limited to the robots, process chamber architectures or transfer chamber architectures illustrated and described herein. Accordingly, while the present disclosure has been disclosed in connection with certain example embodiments, it should be understood that other embodiments may fall within the scope of the disclosure, as defined by the following claims.

What is claimed is:

1. A robot apparatus, comprising:
an arm comprising an inboard end and an outboard end, the inboard end configured to rotate about a shoulder axis;
a first forearm configured for independent rotation relative to the arm about an elbow axis at the outboard end of the arm;
a first wrist member configured for independent rotation relative the first forearm about a first wrist axis at a distal end of the first forearm opposite the elbow axis, wherein the first wrist member comprises a first end effector and a second end effector, and wherein the first wrist member is configured to simultaneously manipulate a first plurality of substrates;
a second forearm configured for independent rotation relative to the arm about the elbow axis;
a second wrist member configured for independent rotation relative the second forearm about a second wrist axis at a distal end of the second forearm opposite the elbow axis, wherein the second wrist member comprises a third end effector and a fourth end effector, and wherein the second wrist member is configured to simultaneously manipulate a second plurality of substrates;
a third forearm configured for independent rotation relative to the arm about the elbow axis; and
a third wrist member configured for independent rotation relative the third forearm about a third wrist axis at a distal end of the third forearm opposite the elbow axis, wherein the third wrist member comprises a fifth end effector and a sixth end effector, wherein the third wrist member is configured to simultaneously manipulate a third plurality of substrates, and wherein a first fixed vertical pitch between the first wrist member and the second wrist member is less than a second fixed vertical pitch between the second wrist member and the third wrist member.

2. The robot apparatus of claim 1, comprising a drive motor assembly comprising:
an arm drive motor configured to cause the independent rotation of the arm;
a first forearm drive motor configured to cause the independent rotation of the first forearm;
a second forearm drive motor configured to cause the independent rotation of the second forearm;
a third forearm drive motor configured to cause the independent rotation of the third forearm;
a first wrist drive motor configured to cause the independent rotation of the first wrist member;
a second wrist drive motor configured to cause the independent rotation of the second wrist member; and
a third wrist drive motor configured to cause the independent rotation of the third wrist member.

3. The robot apparatus of claim 2, wherein the drive motor assembly further comprises an arm shaft at the shoulder axis, a common forearm shaft at the elbow axis, a first wrist shaft at the first wrist axis, a second wrist shaft at the second wrist axis and a third wrist shaft at the third wrist axis,
wherein the drive motor assembly further comprises:
a first driving pulley coupled to a first forearm shaft and configured to cause the independent rotation of the first forearm;
a second driving pulley coupled to a second forearm shaft and configured to cause the independent rotation of the second forearm;
a third driving pulley coupled to the first wrist shaft and configured to cause the independent rotation of the first wrist member;
a fourth driving pulley coupled to the second wrist shaft and configured to cause the independent rotation of the second wrist member; and
a fifth driving pulley coupled to the third wrist shaft and configured to cause the independent rotation of the third wrist member.

4. The robot apparatus of claim 1, wherein the first fixed vertical pitch is equal to a first spacing between a first upper load lock support and a first lower load lock support of a first load lock and wherein the second fixed vertical pitch is equal to a second spacing between a second upper load lock support and a second lower load lock support of a second load lock.

5. The robot apparatus of claim 1, further comprising:
a fourth forearm configured for independent rotation relative to the arm about the elbow axis; and
a fourth wrist member configured for independent rotation relative to the fourth forearm about a fourth wrist axis, wherein the fourth wrist member comprises a seventh end effector and an eighth end effector, and wherein the fourth wrist member is configured to simultaneously manipulate a fourth plurality of substrates.

6. The robot apparatus of claim 5, wherein first forearm, the second forearm, the third forearm and the fourth forearm lie one above another when configured in a folded and zeroed configuration, and wherein the first end effector, the third end effector, the fifth end effector and the seventh end effector lie one above another when in the folded and zeroed configuration, and wherein the second end effector, the fourth end effector, the sixth end effector and the eighth end effector lie one above another when in the folded and zeroed configuration.

7. The robot apparatus of claim 6, comprising a drive motor assembly comprising:
an arm drive motor configured to cause the independent rotation of the arm;
a first forearm drive motor configured to cause the independent rotation of the first forearm;
a second forearm drive motor configured to cause the independent rotation of the second forearm;
a third forearm drive motor configured to cause the independent rotation of the third forearm;
a fourth forearm drive motor configured to cause the independent rotation of the fourth forearm;
a first wrist drive motor configured to cause the independent rotation of the first wrist member;
a second wrist drive motor configured to cause the independent rotation of the second wrist member;
a third wrist drive motor configured to cause the independent rotation of the third wrist member; and
a fourth wrist drive motor configured to cause the independent rotation of the fourth wrist member.

8. The robot of claim 7, wherein the first forearm is coupled to the first wrist member at a first midpoint of the first wrist member, wherein the second forearm is coupled to the second wrist member at a second midpoint of the second wrist member, and wherein the third forearm is coupled to the third wrist member at a third midpoint of the third wrist member.

9. The robot of claim 7, wherein the first forearm is coupled to the first wrist member at a position offset from a first midpoint of the first wrist member, wherein the second forearm is coupled to the second wrist member at a position offset from a second midpoint of the second wrist member, and wherein the third forearm is coupled to the third wrist member at a position offset from a third midpoint of the third wrist member.

10. The robot of claim 1, wherein the first wrist member approximately has a U shape and comprises a first wrist shaft positioned at a bottom center of the U shape, and wherein the first end effector is positioned at a first distal end of the U shape and the second end effector is positioned at a second distal end of the U shape,
wherein the second wrist member approximately has the U shape and comprises a second wrist shaft positioned at a bottom center of the U shape, and wherein the third end effector is positioned at a first distal end of the U shape and the fourth end effector is positioned at a second distal end of the U shape, and
wherein the third wrist member approximately has the U shape and comprises a third wrist shaft positioned at a bottom center of the U shape, and wherein the fifth end effector is positioned at a first distal end of the U shape and the sixth end effector is positioned at a second distal end of the U shape.

11. A robot apparatus, comprising:
a first arm comprising a first inboard end and a first outboard end, the first inboard end configured to rotate about a shoulder axis;
a first forearm configured for independent rotation relative to the first arm about a first elbow axis at the outboard end of the first arm;
a first wrist member configured for independent rotation relative to the first forearm about a first wrist axis at a distal end of the first forearm opposite the first elbow axis, wherein the first wrist member comprises a first end effector and a second end effector, and wherein the first wrist member is configured to simultaneously manipulate a first plurality of substrates;

a second arm comprising a second inboard end and a second outboard end, the second inboard end configured to rotate about the shoulder axis;

a second forearm configured for independent rotation relative to the second arm about a second elbow axis at the outboard end of the second arm;

a second wrist member configured for independent rotation relative to the second forearm about a second wrist axis at a distal end of the second forearm opposite the second elbow axis, wherein the second wrist member comprises a third end effector and a fourth end effector, and wherein the second wrist member is configured to simultaneously manipulate a second plurality of substrates; and a third forearm configured for independent rotation relative to the first arm about a third elbow axis at the outboard end of the second arm; and a third wrist member configured for independent rotation relative to the third forearm about a third wrist axis at a distal end of the third forearm opposite the third elbow axis, wherein the third wrist member comprises a fifth end effector and a sixth end effector, wherein the third wrist member is configured to simultaneously manipulate a third plurality of substrates, and wherein a first fixed vertical pitch between the first wrist member and the second wrist member is less than a second fixed vertical pitch between the second wrist member and the third wrist member.

12. The robot apparatus of claim 11, further comprising a drive motor assembly comprising:
   a first arm drive motor configured to cause the independent rotation of the first arm;
   a second arm drive motor configured to cause the independent rotation of the second arm;
   a first forearm drive motor configured to cause the independent rotation of the first forearm;
   a second forearm drive motor configured to cause the independent rotation of the second forearm;
   a third forearm drive motor configured to cause the independent rotation of the third forearm;
   a first wrist drive motor configured to cause the independent rotation of the first wrist member;
   a second wrist drive motor configured to cause the independent rotation of the second wrist member; and
   a third wrist drive motor configured to cause the independent rotation of the third wrist member.

13. The robot apparatus of claim 12, wherein the drive motor assembly further comprises a common arm shaft at the shoulder axis, a first forearm shaft at the first elbow axis, a second forearm shaft at the second elbow axis, a first wrist shaft at the first wrist axis, a second wrist shaft at the second wrist axis and a third wrist shaft at the third wrist axis,
   wherein the drive motor assembly further comprises:
   a first driving pulley coupled to the first forearm shaft and configured to cause the independent rotation of the first forearm;
   a second driving pulley coupled to the second forearm shaft and configured to cause the independent rotation of the second forearm;
   a third driving pulley coupled to a third forearm shaft and configured to cause the independent rotation of the third forearm;
   a fourth driving pulley coupled to the first wrist shaft and configured to cause the independent rotation of the first wrist member;
   a fifth driving pulley coupled to the second wrist shaft and configured to cause the independent rotation of the second wrist member; and
   a sixth driving pulley coupled to the third wrist shaft and configured to cause the independent rotation of the third wrist member.

14. The robot apparatus of claim 13, further comprising:
   a fourth forearm configured for independent rotation relative to the second arm about the second elbow axis at the outboard end of the second arm; and
   a fourth wrist member configured for independent rotation relative to the fourth forearm about a fourth wrist axis at a distal end of the fourth forearm opposite the second elbow axis, wherein the fourth wrist member comprises a seventh end effector and an eighth end effector, and wherein the fourth wrist member is configured to simultaneously manipulate a fourth plurality of substrates.

15. The robot apparatus of claim 14, wherein the first wrist member, the second wrist member, the third wrist member and the fourth wrist member lie one above another when configured in a folded and zeroed configuration.

16. The robot apparatus of claim 11, wherein the first arm and the second arm are askew to one another and wherein the first forearm and the second forearm are askew to one another when configured in a folded and zeroed configuration.

17. The robot apparatus of claim 11, wherein the first forearm and the third forearm are within the same plane.

18. The robot of claim 11, wherein the first forearm is coupled to the first wrist member at a first midpoint of the first wrist member, wherein the second forearm is coupled to the second wrist member at a second midpoint of the second wrist member, and wherein the third forearm is coupled to the third wrist member at a third midpoint of the third wrist member.

19. The robot of claim 11, wherein the first forearm is coupled to the first wrist member at a position offset from a first midpoint of the first wrist member, wherein the second forearm is coupled to the second wrist member at a position offset from a second midpoint of the second wrist member, and wherein the third forearm is coupled to the third wrist member at a position offset from a third midpoint of the third wrist member.

20. An electronic device manufacturing apparatus, comprising:
   a mainframe comprising a transfer chamber and at least two process chambers;
   a first load lock coupled to the mainframe;
   a second load lock coupled to the mainframe; and
   a robot apparatus configured to transport substrates between the first load lock and the second load lock and the at least two process chambers, the robot apparatus comprising:
   an arm comprising an inboard end and an outboard end, the inboard end configured to rotate about a shoulder axis;
   a first forearm configured for independent rotation relative to the arm about an elbow axis at the outboard end of the arm;
   a first wrist member configured for independent rotation relative the first forearm about a first wrist axis at a distal end of the first forearm opposite the elbow axis, wherein the first wrist member comprises a first end effector and a second end effector, and wherein the first wrist member is configured to simultaneously manipulate a first plurality of substrates;

a second forearm configured for independent rotation relative to the arm about the elbow axis;

a second wrist member configured for independent rotation relative the second forearm about a second wrist axis at a distal end of the second forearm opposite the elbow axis, wherein the second wrist member comprises a third end effector and a fourth end effector, and wherein the second wrist member is configured to simultaneously manipulate a second plurality of substrates;

a third forearm configured for independent rotation relative to the arm about the elbow axis; and a third wrist member configured for independent rotation relative the third forearm about a third wrist axis at a distal end of the third forearm opposite the elbow axis, wherein the third wrist member comprises a fifth end effector and a sixth end effector, wherein the third wrist member is configured to simultaneously manipulate a third plurality of substrates, and wherein a first fixed vertical pitch between the first wrist member and the second wrist member is less than a second fixed vertical pitch between the second wrist member and the third wrist member.

* * * * *